US006930380B2

(12) United States Patent
Shimanuki et al.

(10) Patent No.: US 6,930,380 B2
(45) Date of Patent: Aug. 16, 2005

(54) SEMICONDUCTOR DEVICE

(75) Inventors: Yoshihiko Shimanuki, Nanyo (JP); Hisashi Hasunuma, Yonezawa (JP)

(73) Assignees: Renesas Technology Corp., Tokyo (JP); Renesas Northern Japan Semiconductor, Inc., Hokkaido (JP)

( * ) Notice: Subject to any disclaimer, the term of this patent is extended or adjusted under 35 U.S.C. 154(b) by 0 days.

(21) Appl. No.: 10/860,072

(22) Filed: Jun. 4, 2004

(65) Prior Publication Data

US 2004/0245622 A1 Dec. 9, 2004

(30) Foreign Application Priority Data

Jun. 6, 2003 (JP) ........................................ 2003-162139

(51) Int. Cl.[7] .............................................. H01L 29/73
(52) U.S. Cl. ....................... 257/691; 257/203; 257/208; 257/786
(58) Field of Search ................................ 257/691, 203, 257/208, 786

(56) References Cited

U.S. PATENT DOCUMENTS 5,401,989 A * 3/1995 Kikuchi ...................... 257/211

FOREIGN PATENT DOCUMENTS

| EP | 1 205 974 A2 | * | 6/2001 | ............ H01L/23/50 |
| JP | 63-44734 | * | 2/1988 | .................. 257/203 |
| JP | 63-78549 | * | 4/1988 | .................. 257/203 |
| JP | 3-145153 | * | 6/1991 | .................. 29/827 |
| JP | 6-283604 | | 10/1994 | |
| JP | 11-233636 | * | 8/1999 | ............ H01L/21/82 |

* cited by examiner

Primary Examiner—Jasmine Clark
(74) Attorney, Agent, or Firm—Antonelli, Terry, Stout & Kraus, LLP

(57) ABSTRACT

A semiconductor device includes a semiconductor chip, a plurality of bonding pads which are formed on a main surface of the semiconductor chip and include first power source bonding pads, second power source bonding pads and a plurality of signal bonding pads, a plurality of leads which are arranged around the semiconductor chip and include first power source leads and a plurality of signal leads, a plurality of bonding wires which include first bonding wires for connecting the first power source bonding pads with the first power source leads, second bonding wires for connecting the first bonding pads with second bonding pads and third bonding wires for connecting the plurality of signal bonding pads with the plurality of signal leads, and a sealing body which seals the semiconductor chip, the plurality of bonding wires and some of the plurality of leads.

11 Claims, 43 Drawing Sheets

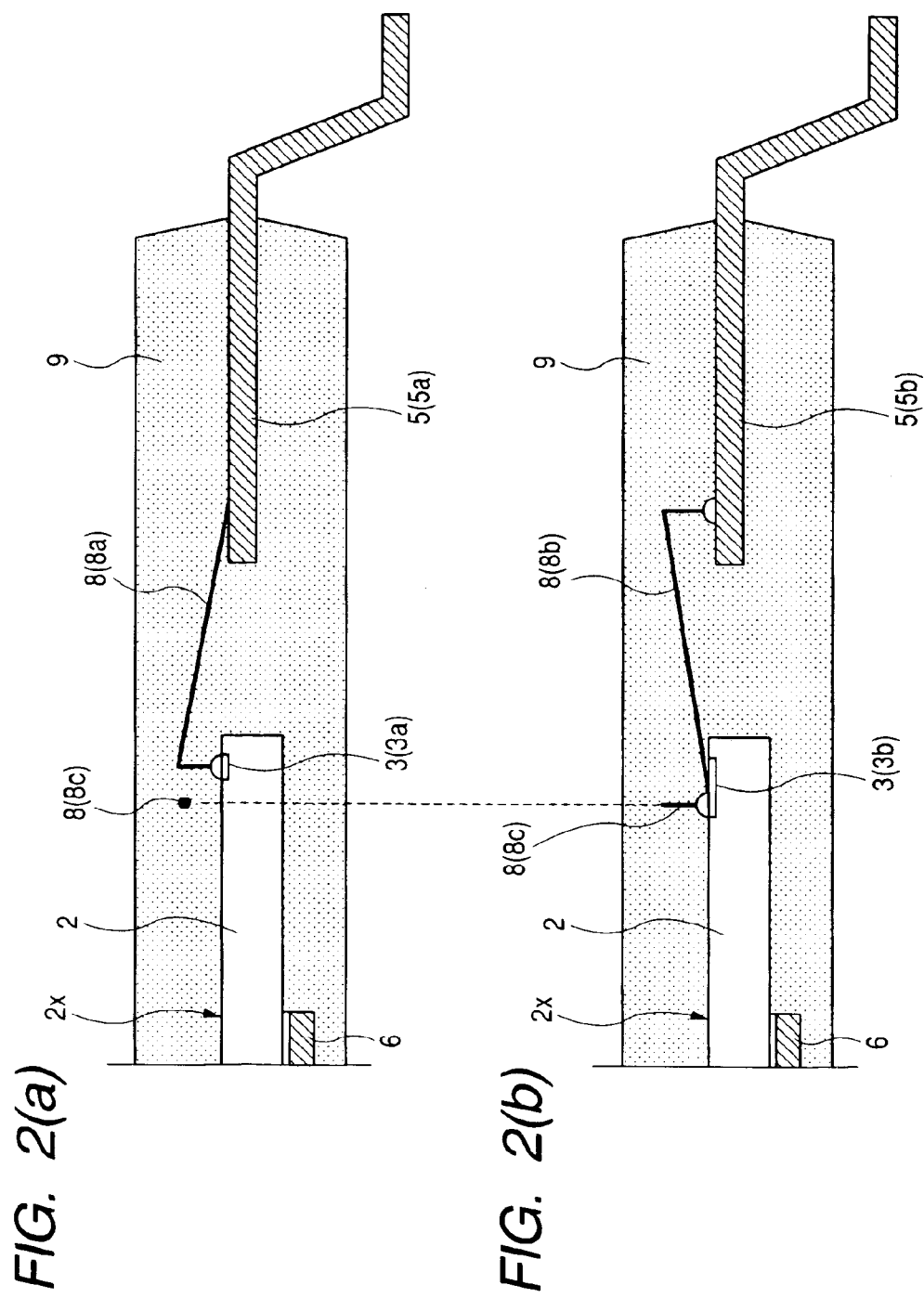

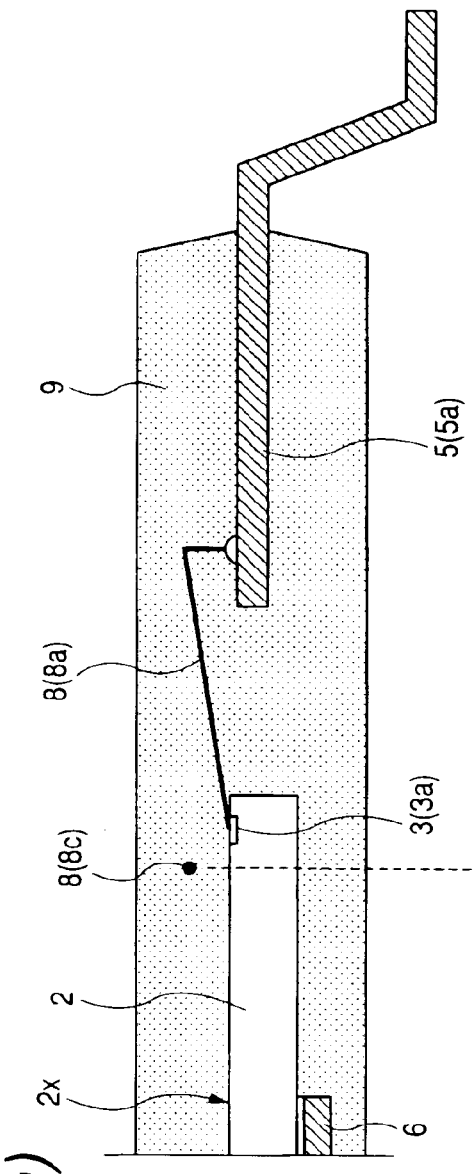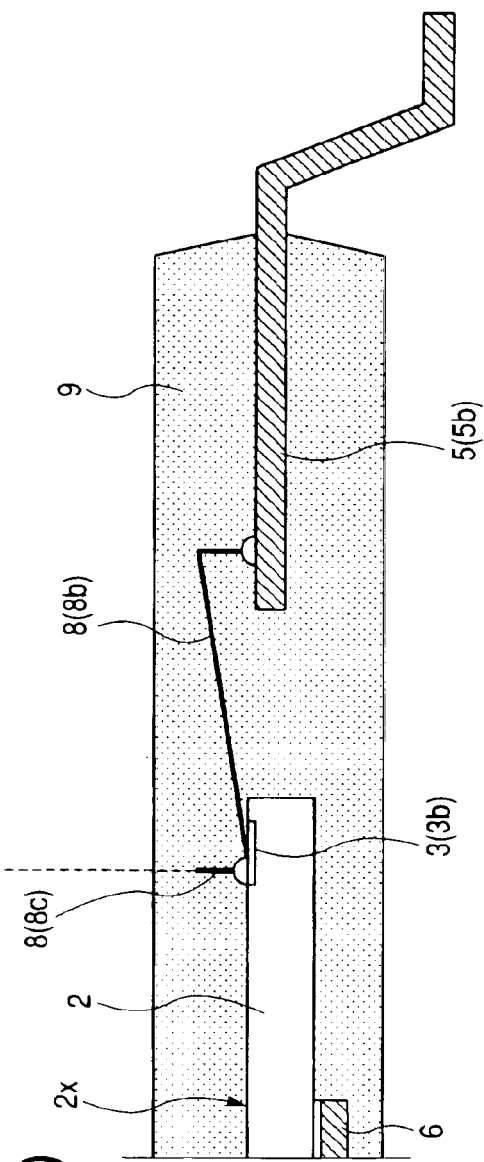
FIG. 12(a)
FIG. 12(b)

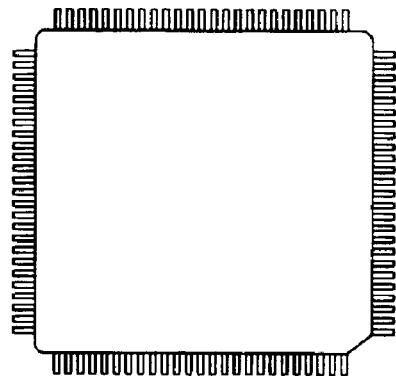
FIG. 33(c) LQFP1414-100
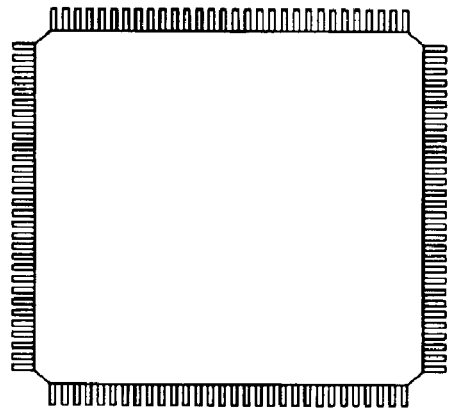
FIG. 33(b) LQFP1616-120
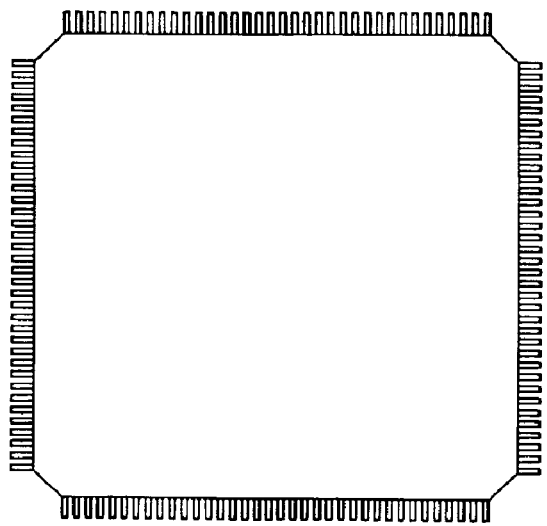
FIG. 33(a) LQFP2020-144

SEMICONDUCTOR DEVICE

CROSS-REFERENCE TO RELATED APPLICATION

The present application claims priority from Japanese patent application JP 2003-162139, filed on Jun. 6, 2003, the content of which is hereby incorporated by reference into this application.

BACKGROUND OF THE INVENTION

The present invention relates to a semiconductor device, and, more particularly, to a technique which is effectively applicable to a semiconductor device in which bonding pads of a semiconductor chip are connected to connecting portions which are arranged around the semiconductor chip using bonding wires.

Semiconductor devices having various package structures, which differ depending on the functions and kinds of integrated circuits mounted on a semiconductor chip, have been commercialized. As one example of these semiconductor devices, there is a semiconductor device which is referred to as a QFP (Quad Flatpack Package) type semiconductor device. The QFP type semiconductor device is mainly constituted of a semiconductor chip having a main surface on which a plurality of bonding pads and a plurality of buffer cells are arranged, a plurality of leads arranged around the semiconductor chip, a plurality of bonding wires which electrically connect the plurality of the bonding wires of the semiconductor chip and the plurality of leads, respectively, support bodies (tabs, die pads) provided for supporting the semiconductor chips, suspending leads which are integrally formed with the support bodies, and a sealing body which seals the semiconductor chip, the plurality of bonding wires, and inner lead portions of the plurality of leads.

The plurality of bonding pads include a plurality of signal bonding pads and a plurality of power source bonding pads, and then are arrange along respective sides of the semiconductor chip. The plurality of buffer cells include a plurality of input-output cells (I/O cells) and a plurality of power source cells, wherein the plurality of input-output cells are arranged at locations corresponding to the plurality of respective signal bonding pads and the plurality of power source cells are arranged at locations corresponding to the plurality of respective power source bonding pads. The plurality of leads include a plurality of signal leads and a plurality of power source leads, wherein the plurality of signal leads are arranged at locations corresponding to the plurality of respective signal bonding pads and the plurality of power source leads are arranged at locations corresponding to the plurality of respective power source bonding pads.

A technique for respectively electrically connecting the plurality of bonding pads of the semiconductor chip with the plurality of leads arranged around the semiconductor chip is described in Japanese Unexamined Patent Publication Hei 6(1994)-283604, for example.
[Patent Reference 1]
Japanese Unexamined Patent Publication Hei 6(1994)-283604

SUMMARY OF THE INVENTION

The number of bonding pads of a semiconductor chip is steadily increasing along with the demand for higher packaging and multi-functioning of the integrated circuits which are mounted on the semiconductor chip. The number of leads increases along with an increase in the number of bonding pads, and, hence, the profile size of the semiconductor device has increased. Accordingly, efforts have been made to miniaturize the semiconductor device by narrowing the arrangement pitch of leads by minimizing the size of the leads. With respect to a recent QFP type semiconductor device, the arrangement pitch gas been narrowed to a level of 0.3 [mm] to 0.4 [mm]. However, a given bonding area is necessary to ensure reliability at the time of mounting the semiconductor device on a printed wiring circuit board by soldering, and a sufficient mechanical strength is necessary to some extent to suppress bending of the leads. Accordingly, it is considered that further miniaturization of the semiconductor device by the further minimization of size of the leads is difficult.

In view of the above, the inventors of the present invention have focused their attention on the fact that a plurality of power source bonding pads and a plurality of power source leads are provided for one operational potential (for example, Vcc=3.3[V]) to ensure stable operation of the integrated circuits mounted on a semiconductor chip, and, in response to such investigations, they have made the present invention.

It is an object of the present invention to provide a technique which can miniaturize a semiconductor device.

The abovementioned and further objects and novel features of the present invention will become apparent from the description provided in this specification and the attached drawings.

A summary of representative aspects and features of the invention disclosed in this specification, they are as follows.

That is, bonding pads having the same function which are arranged on a main surface of a semiconductor chip are electrically connected to each other using bonding wires. For example, the semiconductor device has the following constitution.

The semiconductor device includes a semiconductor chip, a plurality of bonding pads which are formed on a main surface of the semiconductor chip and which include first power source bonding pads, second power source bonding pads and a plurality of signal bonding pads, a plurality of leads which are arranged around the semiconductor chip and include first power source leads and a plurality of signal leads, a plurality of bonding wires which include first bonding wires for connecting the first power source bonding pads with the first power source leads, second bonding wires for connecting the first bonding pads with second bonding pads and the plurality of third bonding wires for connecting the plurality of signal bonding pads with a plurality of signal leads, and a sealing body which seals the semiconductor chip, the plurality of bonding wires and some of the plurality of leads.

According to the abovementioned example, it is possible to reduce the number of power source leads which are electrically connected to second power source leads via the bonding wires and, hence, the semiconductor device can be miniaturized.

BRIEF DESCRIPTION OF THE DRAWINGS

FIG. 2(*a*) and FIG. 2(*b*) are views showing the inner structure of the semiconductor device according to the embodiment 1 of the present invention, wherein FIG. 2(a) is a diagrammatic cross-sectional view along the signal lead and FIG. 2(b) is a diagrammatic cross-sectional view along power source leads;

FIG. 12(a) and FIG. 12(b) are views showing the inner structure of the semiconductor device according to a modification of the embodiment 1 of the present invention, wherein FIG. 12(a) is a cross-sectional view along the signal lead and FIG. 12(b) is a cross-sectional view along power source leads;

FIG. 13(a) and FIG. 13(b) are views showing the inner structure of the semiconductor device according to a modification of the embodiment 2 of the present invention, wherein FIG. 13(a) is a cross-sectional view along the signal lead and FIG. 13(b) is a cross-sectional view along power source leads;

FIG. 15(a) and FIG. 15(b) are views showing the inner structure of a semiconductor device according to an embodiment 2 of the present invention, wherein FIG. 15(a) is a plan view and FIG. 15(b) is a cross-sectional view;

FIG. 16(a) and FIG. 16(b) are views showing the inner structure of the semiconductor device according to the embodiment 2 of the present invention, wherein FIG. 16(a) is a cross-sectional view along the signal lead and FIG. 16(b) is a cross-sectional view along power source leads;

FIG. 22 is a cross-sectional view showing the inner structure of the semiconductor chip in FIG. 20, FIG. 23(a) and FIG. 23(b) are views showing the inner structure of a semiconductor device according to an embodiment 3 of the present invention, wherein

FIG. 24(a) and FIG. 24(b) are views showing the inner structure of a semiconductor device according to an embodiment 4 of the present invention, wherein FIG. 24(a) is a plan view and FIG. 24(b) is a cross-sectional view;

FIG. 25(a) and FIG. 25(b) are views showing the inner structure of a semiconductor device according to an embodiment 5 of the present invention, wherein FIG. 25(a) is a plan view and FIG. 25(b) is a cross-sectional view;

FIG. 26(a) and FIG. 26(b) are views showing the inner structure of a semiconductor device according to an embodiment 6 of the present invention, wherein FIG. 26(a) is a plan view and FIG. 26(b) is a cross-sectional view;

FIG. 33(a) to FIG. 33(c) are views showing a profile of the semiconductor device for explaining advantageous effects of the present invention more specifically, wherein FIG. 33(a) is a standard profile view and FIG. 33(b) and FIG. 33(c) are profile views to which the present invention is applied;

FIG. 34(a) and FIG. 34(b) are views showing the inner structure of a semiconductor device according to a modification of an embodiment 1 of the present invention, wherein FIG. 34(a) is a plan view and FIG. 34(b) is a cross-sectional view;

FIG. 35(a) and FIG. 35(b) are views showing the inner structure of a semiconductor device according to a modification of an embodiment 4 of the present invention, wherein FIG. 35(a) is a plan view and FIG. 35(b) is a cross-sectional view;

FIG. 36(a) and FIG. 36(b) are views showing the inner structure of a semiconductor device according to a modification of an embodiment 6 of the present invention, wherein FIG. 36(a) is a plan view and FIG. 36(b) is a cross-sectional view;

FIG. 37(a) and FIG. 37(b) are views showing the inner structure of a semiconductor device according to a modification of an embodiment 6 of the present invention, wherein FIG. 36(a) is a plan view and FIG. 36(b) is a cross-sectional view;

FIG. 38(a) and FIG. 38(b) are views showing the inner structure of a semiconductor device according to a modification of an embodiment 6 of the present invention, wherein FIG. 36(a) is a plan view and FIG. 36(b) is a cross-sectional view;

FIG. 39(a) and FIG. 39(b) are views showing the inner structure of a semiconductor device according to a modification of an embodiment 7 of the present invention, wherein FIG. 36(a) is a plan view and FIG. 36(b) is a cross-sectional view;

FIG. 40(a) and FIG. 40(b) are views showing the inner structure of a semiconductor device according to a modification of an embodiment 1 of the present invention, wherein FIG. 40(a) is a plan view and FIG. 40(b) is a cross-sectional view;

FIG. 41(a) and FIG. 41(b) are views showing the inner structure of a semiconductor device according to a modification of an embodiment 7 of the present invention, wherein FIG. 41(a) is a plan view and FIG. 41(b) is a cross-sectional view;

DESCRIPTION OF THE PREFERRED EMBODIMENTS

Figure 1A:
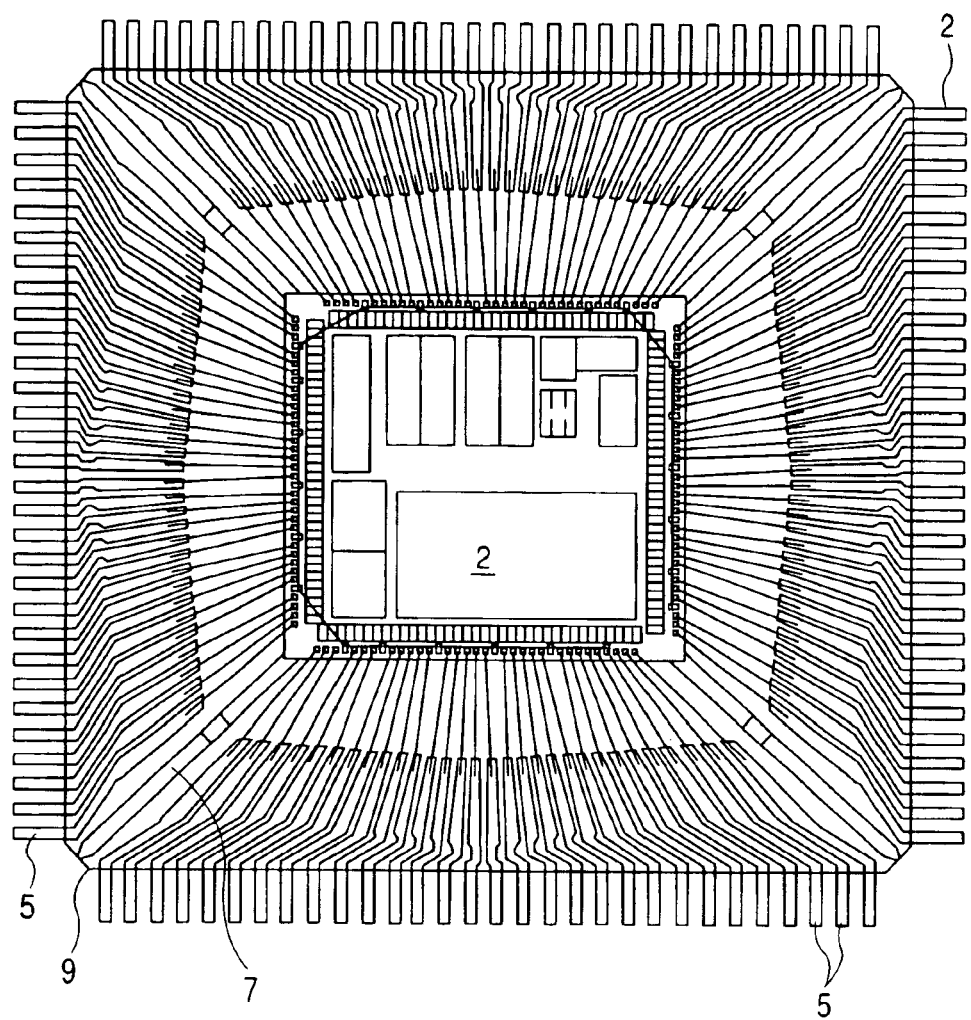
FIG. 1(*a*) and FIG. 1(*b*) are views showing the inner structure of a semiconductor device according to an embodiment 1 of the present invention, wherein FIG. 1(*a*) is a diagrammatic plan view and FIG. 1(*b*) is a diagrammatic cross-sectional view.
Figure 1B:
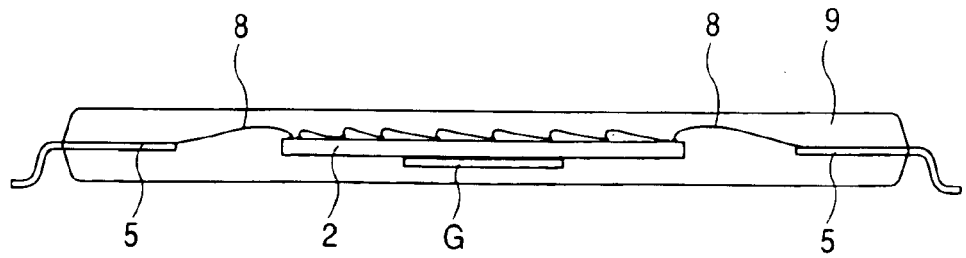
Figure 3:
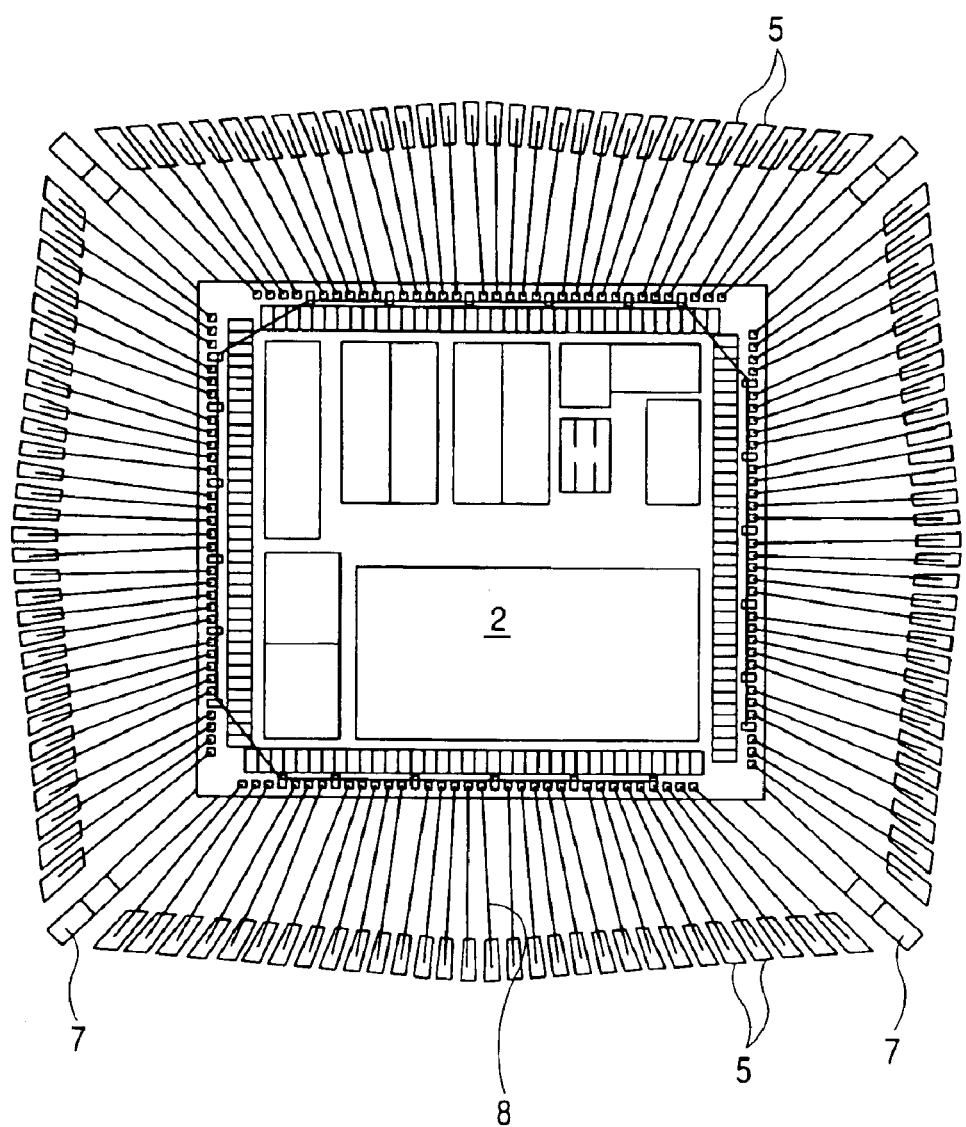
FIG. 3 is plan view in which a portion of FIG. 1(a) is enlarged.

Preferred embodiments of the present invention will be described in detail in conjunction with the attached drawings hereinafter. In all of the drawings, the same symbols are used to identify identical parts, and a repeated explanation thereof is omitted.

Embodiment 1

In this embodiment 1, an explanation will be directed to an example in which the present invention is applied to a QFP (Quad Flatpack Package) type semiconductor device with reference to FIGS. 1(a) to 11.

As shown in FIG. 1(a) to FIG. 3, the semiconductor device of this embodiment 1 is mainly constituted of a semiconductor chip 2, a plurality of leads 5, a plurality of bonding wires 8, a sealing body 9 and the like. The semiconductor chip 2 is fixed by adhesion to a support body 6, which is referred to as a tab or a die pad, while, for example, four suspension leads 7 are integrally connected to the support body 6.

Figure 7:
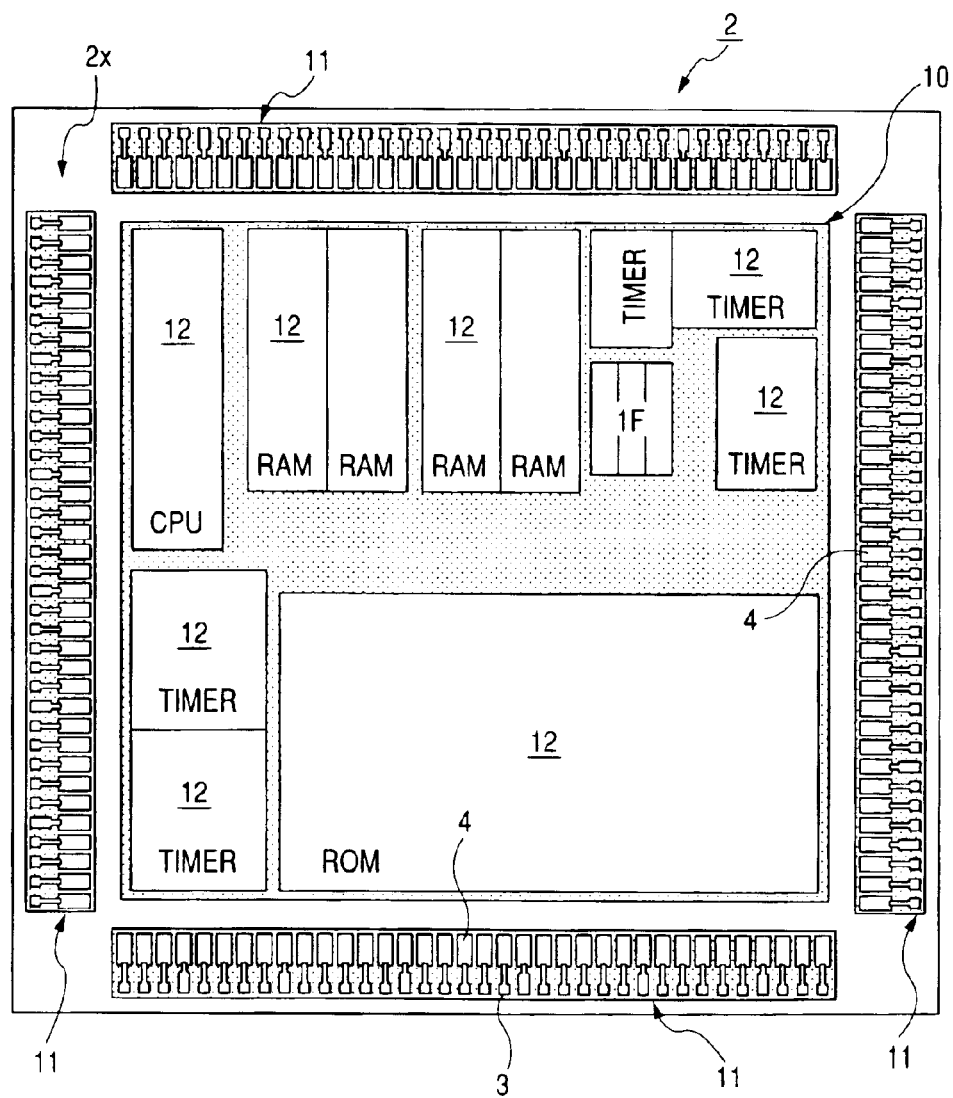
FIG. 7 is a planar layout view of a semiconductor chip shown in FIG. 1(a)

As shown in FIG. 7, the planar shape of the semiconductor chip 2 along the thickness direction thereof is formed in a quadrangular shape. In this embodiment 1, for example, the planar shape of the semiconductor chip 2 is formed in a square shape having a size of 7.6 [mm]×7.6 [mm].

Figure 11:
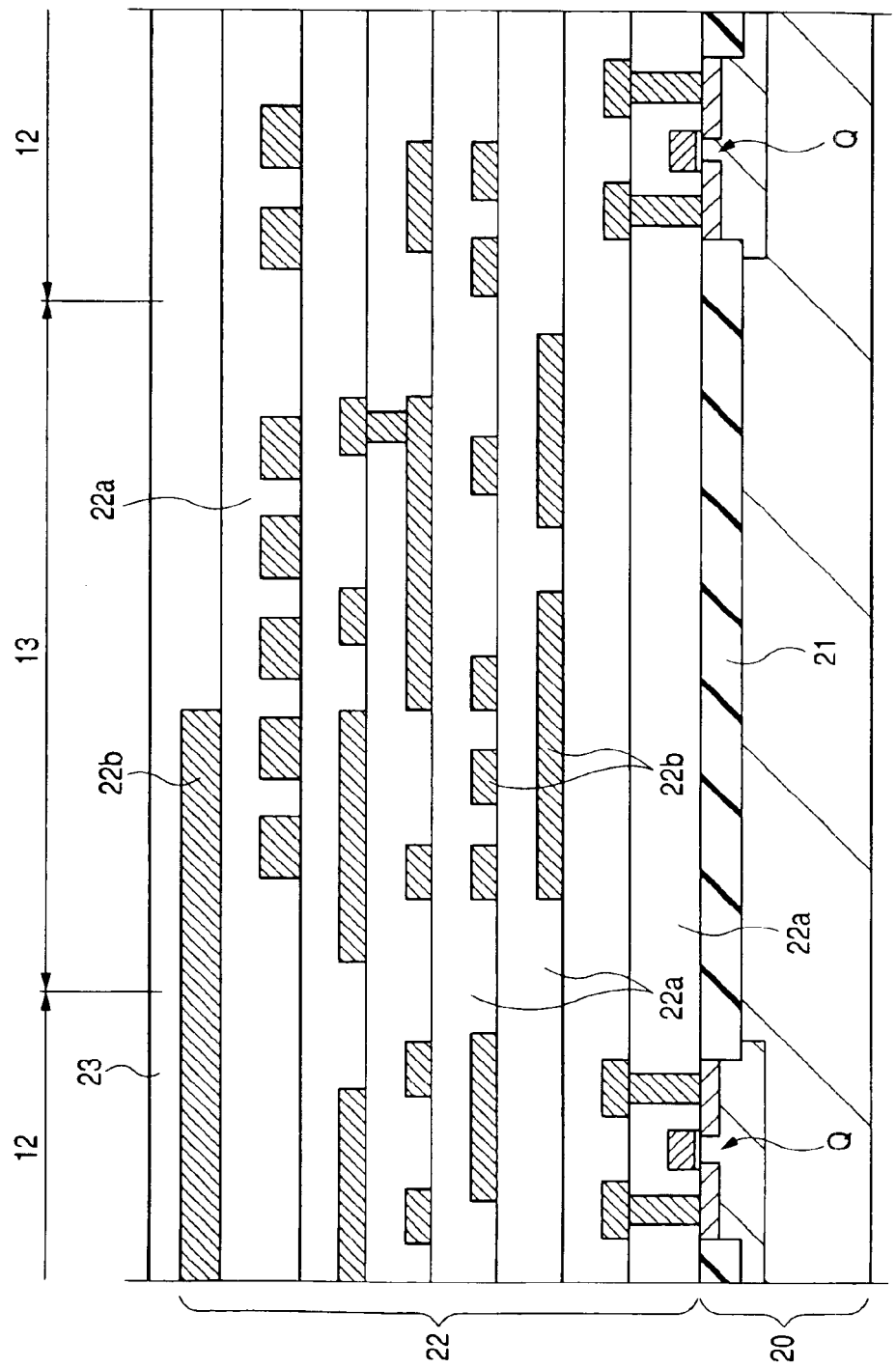
FIG. 11 is a cross-sectional view showing the inner structure of the semiconductor chip shown in FIG. 7.

Although the semiconductor chip 2 is not limited to the following constitution, as shown in FIG. 11, the semiconductor chip 2 includes mainly a semiconductor board 20 and, on a main surface of the semiconductor board 20, a multi-layered wiring layer 22 which is formed by stacking insulation layers 22a and wiring layers 22b in a plurality of stages, and a surface protective film (a final protective film) 23 which covers the multilayered wiring layer 22.

The insulation layers 23a are formed of a silicon oxide film, for example. The wiring layers 22b are formed of a metal film made of, for example, aluminum (Al), aluminum alloy, copper, copper alloy and the like. The surface protective film 23 is formed of a multilayered film which is formed by stacking an inorganic insulation film such as a silicon oxide film, a silicon nitride film and the like and an organic film. The semiconductor chip 2 of this embodiment 1 has, for example, a seven-layered metal wiring structure.

For example, a microcomputer which constitutes an integrated circuit is mounted on the semiconductor chip 2. As shown in FIG. 7, on a main surface 2x of the semiconductor chip 2, an internal circuit forming portion 10 is arranged. In the internal circuit forming portion 10, there is an internal circuit including a plurality of circuit blocks 12 which are divided by wiring channel regions. The plurality of circuit blocks 12 include, for example, the circuit block in which a CPU (Central Processing Unit) is formed as an arithmetic computing circuit, the circuit block in which a RAM (Random Access Memory) is formed as a storage circuit, the circuit block in which a ROM (Read Only Memory) is formed as a storage circuit, the circuit block in which a timer is formed, and the circuit block in which an IF (Serial Communication Interface Circuit) is formed.

On the main surface 2x of the semiconductor chip 2, four interface circuit forming portions 11 are arranged corresponding to respective sides of the semiconductor chip 2. The four interface circuit forming portions 11 are arranged to surround the internal circuit forming portion 10 in a plane.

Figure 8:
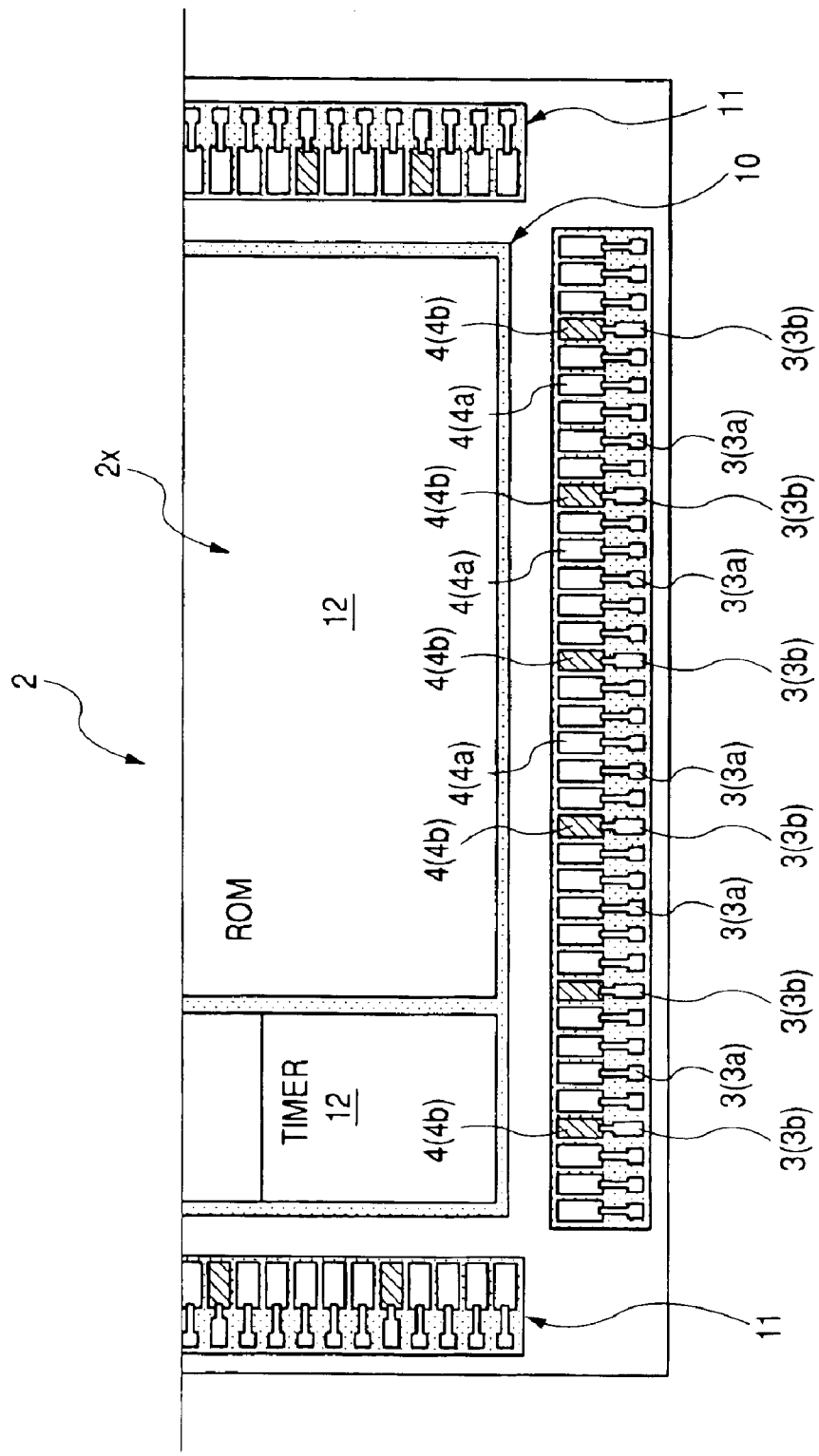
FIG. 8 is a planar layout view in which a portion of FIG. 7 is enlarged.

In each interface circuit forming portion 11, as shown in FIG. 7 and FIG. 8, an interface circuit which includes a plurality of bonding pads 3 and a plurality of buffer cells 4 is arranged. The plurality of bonding pads 3 include a plurality of signal bonding pads 3a and a plurality of power source bonding pads 3b, while the plurality of buffer cells 4 include a plurality of input/output cells (I/O cells) 4a and a plurality of power source cells 4b.

In each of the interface circuit forming portions 11, the plurality of bonding pads 3 and the plurality of buffer cells 4 are arranged along sides of the semiconductor chip 2. The plurality of bonding pads 3 are arranged between the sides of the semiconductor chip 2 and the plurality of buffer cells 4, wherein the plurality of input/output cells 4a are arranged at locations corresponding to the plurality of signal bonding pads 3a and the plurality of the power source cells 4b are arranged at locations corresponding to the plurality of power source bonding pads 3b.

Figure 9:
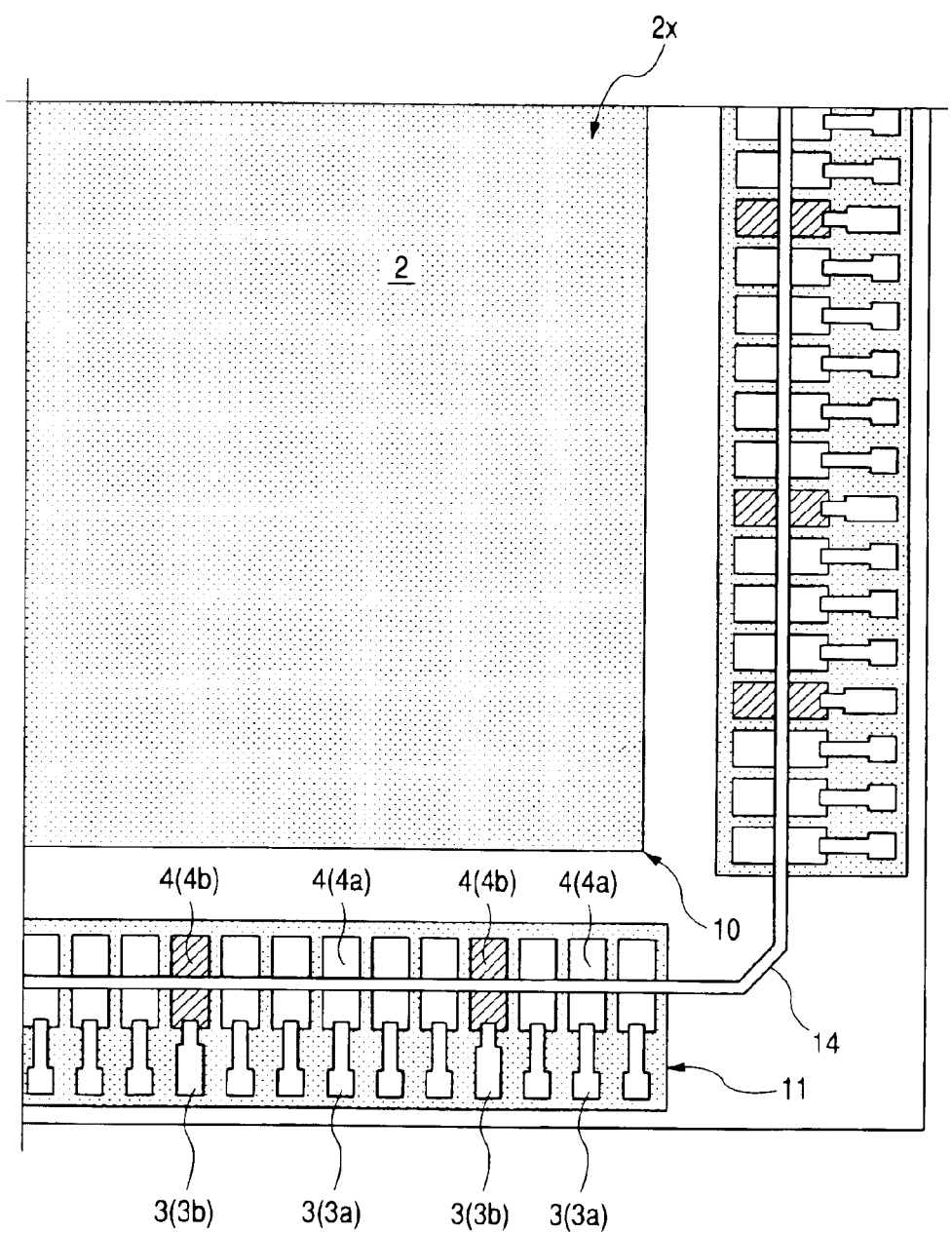
FIG. 9 is a planar layout view in which a portion of FIG. 7 is enlarged.

As shown in FIG. 9, on the interface circuit forming portions 11, a power source line 14 which supplies an operational potential to the plurality of input/output cells 4a is arranged. The power source line 14 is continuously extended in a ring-like shape such that the power source line 14 surrounds the internal circuit forming portion 10 in a plane.

The signal bonding pads 3a are electrically connected with the corresponding input/output cells 4a, while the power source bonding pads 3b are electrically connected with the corresponding power source cells 4b. Further, the plurality of power source cells 4b are electrically connected with the power source line 14, while the power source line 14 is electrically connected with the plurality of input/output cells 4a.

The input/output cells 4a are cells which include circuits for transmitting and receiving input/output signals, while the power source cells 4b are cells for supplying the operational potential necessary for the circuit operation of the input/output cells 4a.

For operating the plurality of the input/output cells 4a in a stable manner, the plurality of power source bonding pads 3b are, as shown in FIG. 8 and FIG. 9, arranged to sandwich the plurality of signal bonding pads 3a in a plane.

As a transistor element which constitutes the internal circuit and the interface circuit, for example, a MISFET (Metal Insulator Semiconductor Field Effect Transistor) is used. For the purpose of achieving low power consumption and rapid processing, the arithmetic computing circuit of the internal circuit uses a MISFET which is operated with an operational potential lower than the operational potential for operating the MISFET which constitutes the buffer cells 4 of the interface circuit. For example, the arithmetic computing circuit of the internal circuit uses a MISFET which is operated with an operational potential of 1.8[V], while buffer cell 4 of the interface circuit uses a MISFET which is operated with an operational potential of 3.3[V].

Figure 10:
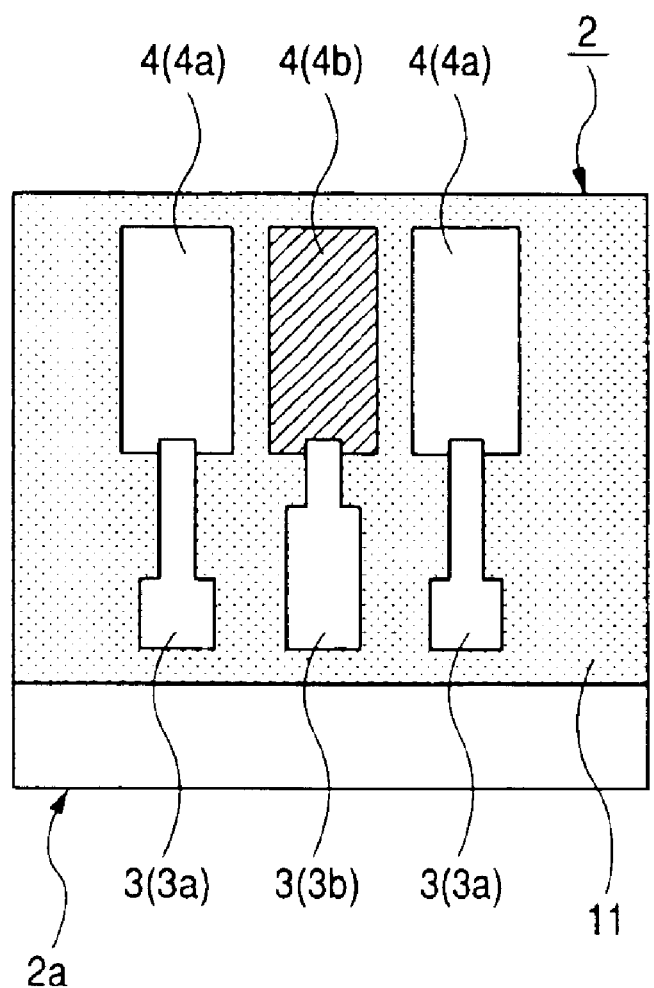
FIG. 10 is a planar layout view in which a portion of FIG. 7 is enlarged.

As shown in FIG. 10, the signal bonding pads 3a and the power source bonding pads 3b have the respective planar surfaces thereof formed in a quadrangular shape. In the embodiment 1, the signal bonding pad 3a is formed in a square shape having a size of 0.1 [mm]×0.1 [mm], for example, while the power source bonding pad 3b is formed in a rectangular shape having a size of 0.1 [mm]×0.2 [mm], for example. The power source bonding pads 3b are arranged along the same direction as the direction that longitudinal sides of the power source bonding pads 3b extend away from the sides 2a of the semiconductor chip 2.

As shown in FIGS. 1(a), 1(b) and FIGS. 2(a), 2(b), the semiconductor chip 2, some of the plurality of leads 5, the support body 6, four suspending leads 7, the plurality of bonding wires 8 and the like are sealed by the sealing body 9. The sealing body 9 has a planar shape thereof along a thickness direction thereof formed in a quadrangular shape. In this embodiment 1, the planar shape of the sealing body 9 is formed in a square shape having a size of 16 [mm]×16 [mm], for example.

For reducing stress in the sealing body 9, the sealing body 9 is formed of, for example, a biphenyl-based thermosetting resin to which a phenol-based curing agent, silicone rubber, a filler and the like are added. Further, the sealing body 9 is formed by a transfer molding method which is suitable for mass production. The transfer molding method is a technique which uses a forming mold having a pot, runners, resin injection gates, a cavity and the like, and it forms a sealing body by injecting thermosetting resin such as epoxy resin, for example, into the cavity from the pot through the runners and the resin injection gates.

The plurality of leads 5 are, as shown in FIG. 1(a) to FIG. 3, arranged around the semiconductor chip 2 such that the leads 5 surround the semiconductor chip 2 in a plane. Further, the plurality of leads 5 are arranged along the respective sides of the sealing body 9.

The plurality of leads 5 extend over the inside and the outside of the sealing body 9 and are constituted of inner lead portions (inner leads) which are positioned inside the sealing body 9 and outer lead portions (outer leads) which are positioned outside the sealing body 9.

The inner lead portions of the plurality of leads 5 extend from the side surfaces of the sealing body 9 to the side surfaces of the semiconductor chip 2 and respective distal end portions thereof are provided with connecting portions to which the bonding wires 8 are connected.

The outer lead portions of the plurality of leads 5 are molded in a gull wing shape which constitutes one example of typical surface mounting type lead shapes. The outer lead portions molded in a gull wing shape include first portions which project from the side surfaces of the sealing body 9 and second portions which are bent downwardly (a back surface side out of a main surface and a back surface of the sealing body 9 which are positioned at sides opposite from each other) from the first portions, and third portions which extend in the same direction as the projecting direction of the first portions from the second portions. The third portions of the outer lead portions are used as external connection terminals at the time of mounting the semiconductor device on the printed wiring circuit board by soldering.

As shown in FIG. 2(a) to FIG. 5, the plurality of leads 5 include the plurality of signal leads 5a and, further, include one power source lead 5b to which the operational potential Vcc of 3.3[V], for example, is applied. The plurality of bonding wires 8 include a plurality of bonding wires 8a which respectively electrically connect the plurality of signal bonding pads 3a of the semiconductor chip 2 with the plurality of signal leads 5a. The plurality of bonding wires 8 further include a bonding wire 8b which electrically connects an arbitrary power source bonding pad 3b of the plurality of power source bonding pads 3b of the semiconductor chip 2 with the power source lead 5b. The plurality of bonding wires 8 still further include a plurality of bonding wires 8c which electrically connect the power source bonding pads 3b of the semiconductor chip 2 having the same function to each other.

Figure 4:
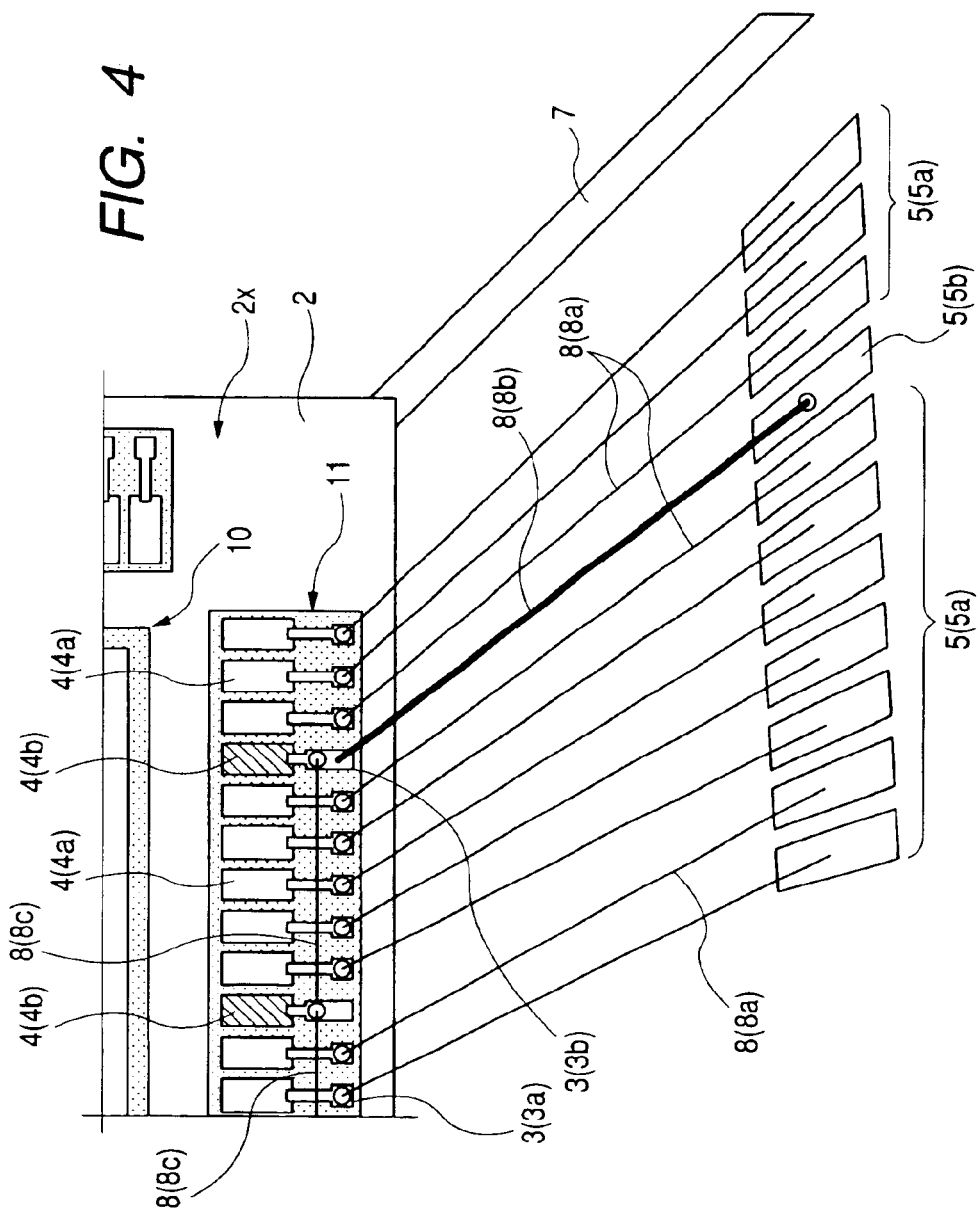
FIG. 4 is plan view which shows a portion of FIG. 3.
Figure 5:
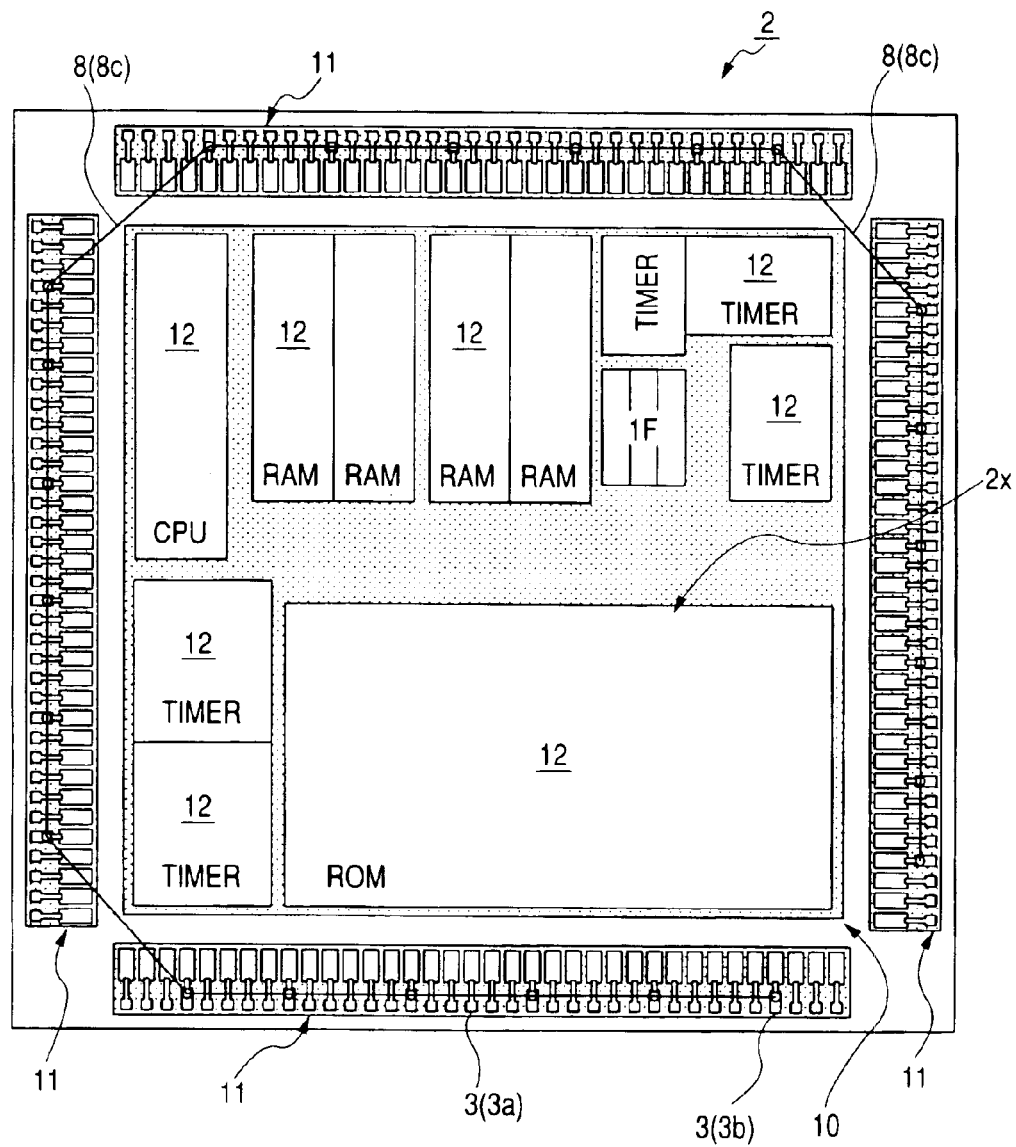
FIG. 5 is schematic plan view which shows a portion of FIG. 3.

As shown in FIG. 4 and FIG. 5, of the plurality of power source bonding pads 3b, an arbitrary power source bonding pad 3b is electrically connected with the power source lead 5b via the bonding wire 8b. The electric connection is established between the respective power source bonding pads 3b including the arbitrary power source bonding pad 3b using the bonding wire 8c. That is, the arbitrary power source bonding pad 3b which is electrically connected with the power source lead 5b to which the operational potential Vcc is applied via the bonding wire 8b is connected to the plurality of power source bonding pads 3b except for the arbitrary power source bonding pad 3b using the bonding wire 8c. Due to such a constitution, it is possible to reduce the number of power source leads 5b by an amount corresponding to the number of power source bonding pads 3b which are electrically connected with the arbitrary power source bonding pads 3b via the bonding wire 8c, and, hence, the semiconductor device can be miniaturized. In the embodiment 1, for example, while 24 power source bonding pads 3b are provided, one power source lead 5b is connected with one of the power source bonding pads 3b via the bonding wire 8b, and, hence, 23 power source leads 5b can be eliminated.

The superiority of the present invention will be further explained in conjunction with FIGS. 33(a) to 33(c). As shown in FIG. 33(a), when the semiconductor chip is packaged in the conventional manner, the package has a profile size which is 20 mm×20 mm and the number of lead pins becomes 144 (hereinafter the package will be expressed as a 2020-144pin package). However, as shown in FIG. 33(b), when the constitution described in the embodiment 1 is applied to the bonding pads for the reference potential (Vss: 0V, for example), the package becomes a 1616-120pin package, and, hence, the package area can be reduced to 64% of the conventional structure. Here, in addition to the abovementioned bonding pads for the reference potential (Vss), the constitution described in the embodiment 1 may be applied to the bonding pads for the power source potential (Vcc: 3.3V, for example). In this case, as shown in FIG. 33(c), the package becomes a 1414-100pin package, and, hence, the package area can be reduced to 49% of the conventional structure. Here, in FIG. 33(a), FIG. 33(b) and FIG. 33(c), to enable a viewer to grasp the package size shrinking effect more visually, the respective packages are depicted at ratios that the package 2020-144pin package shown in FIG. 33(a) assumes the size of 100%.

Further, in the application of the present invention to a semiconductor device, when the package size is not reduced, it is possible to widen the pitch of the outer leads. Accordingly, narrowing the pitch of the printed wiring circuit board for mounting the packages can be alleviated, and, hence, mounting of the semiconductor device on the printed wiring circuit board is facilitated. Further, since the width between the outer leads can be increased, the reliability after soldering is enhanced.

As the bonding wires 8, gold (Au) wires are used. Gold exhibits a low specific resistance compared to Al or Cu which is generally used as a wiring material of the semiconductor chip 2. Further, the diameter of the bonding wire is approximately several tens micron, which is a relatively large value, while a thickness of the wiring of the semiconductor chip 2 is reduced to several microns to several hundreds of microns. Accordingly, there exists a tendency that the sheet resistance of the bonding wires is considerably lower than the sheet resistance of the wiring of the semiconductor chip 2. That is, the electrical resistance of the bonding wires 8 is lower than the electrical resistance of the power source line 14. In this manner, by connecting the arbitrary power source bonding pad 3b with the power source lead 5b using the Au wire and by connecting between the respective power source bonding pads 3b including the arbitrary power source bonding pad 3b using Au wire, it is possible to uniformly supply the operational potential to the respective power source bonding pads 3b without generating a large potential difference.

As shown in FIG. 4 and FIG. 5, the plurality of bonding pads 3 which include the plurality of signal bonding pads 3a and the plurality of power source bonding pads 3b are arranged along the respective sides of the semiconductor chip 2 such that these bonding pads 3 surround the internal circuit forming portion 10 in a plane. On the other hand, the bonding wire 8c connects the power source bonding pads 3b to each other, wherein the power source bonding pads 3b sandwich a given number of signal bonding pads 3a therebetween. That is, at respective sides of the semiconductor chip 2, the bonding wire 8c which connects between the power source bonding pads 3b extends along the sides of the semiconductor chip 2.

In connecting the power source bonding pads 3b to each other by way of the bonding wire 8c in this manner, in order to avoid contact between the bonding wires 8a connected to the signal bonding pads 3a and the bonding wire 8c, it is necessary to perform the connection between the power source bonding pads 3b and the bonding wire 8c at a position more remote from the side of the semiconductor chip 2 than the connection between the signal bonding pads 3a and the bonding wires 8a. To put such a connection mode into practice, as shown in FIG. 10, it is effective to form the power source bonding pad 3b in a rectangular shape and to arrange the power source bonding pad 3b such that the long sides thereof are positioned away from the sides of the semiconductor chip 2. However, as a length of the long side of the power source bonding pads 3b, it is necessary to ensure a length which prevents the bonding wire 8b from interfering with the bonding wires 8a. It is preferable that the length of the long sides of the power source bonding pads 3b is twice or more times greater than a length of the sides of the signal bonding pads 3a which extend along the same direction as the long sides of the power source bonding pads 3b or is twice or more times greater than the length of the short sides of the signal bonding pads 3a.

By forming the power source bonding pad 3b in such a rectangular shape, it is possible to connect the power source bonding pads 3b to each other using the bonding wire 8c while preventing the power source bonding pads 3b from coming into contact with the bonding wire 8a that is connected to the signal bonding pad 3a.

Here, the size and the shape of the power source bonding pad may be sufficient when two bonding wires can be connected to the power source bonding pad basically. For example, when the number of bonding pads is small compared to the size of the semiconductor chip and there exists a tolerance with respect to the pad interval, for example, the power source bonding pads at both sides may be set to a length which can prevent the bonding wire 8b from interfering with the bonding wire 8a. In this case, although the number of bonding pads of the semiconductor chip is decreased compared to the abovementioned example of the longitudinal bonding pads, the connection region of the bonding pad to which the bonding wires are connected is increased, and, hence, it is possible to sufficiently ensure a desired margin of accuracy with respect to the size or a landing point of the capillary.

The bonding wires 8a are, as shown in FIG. 2(a), connected by a nail head bonding (ball bonding) method which performs the primary connection at the signal bonding pads 3a of the semiconductor chip 2 and performs the secondary connection at the connecting portions of the signal leads 5. The nail head bonding method performs the primary connection by forming balls on distal end portions of the wires and, thereafter, by bonding the balls to the first connecting portions using thermal compression bonding processing; and, thereafter, it performs the secondary connection by pulling around the wires to the second connecting portions and, thereafter, the wires are connected to the second connecting portions while applying ultrasonic vibrations.

On the other hand, the bonding wire 8b is, as shown in FIG. 2(b), connected by a reverse nail head bonding method which performs the primary connection at the power source lead 5b and performs the secondary connection at the arbitrary power source bonding pad 3b of the semiconductor chip 2. In this manner, by performing the wire connection of the power source lead 5b and the power source bonding pad 3b using the reverse nail head bonding method, the height of the bonding wire 8b on the power source bonding pad 3b can be lowered, and, hence, the distance between the capillary and the bonding pad 3b at the time of connecting the bonding wire 8c to the bonding pad 3b can be widened. As a result, compared to a case in which the wire connection of the power source bonding pad 3b with the power source lead 5b is performed by a nail head bonding method similar to the nail head bonding method used for the signal bonding wires 8a shown in FIG. 2(a), an area of the power source bonding pad can be reduced.

Figure 6:
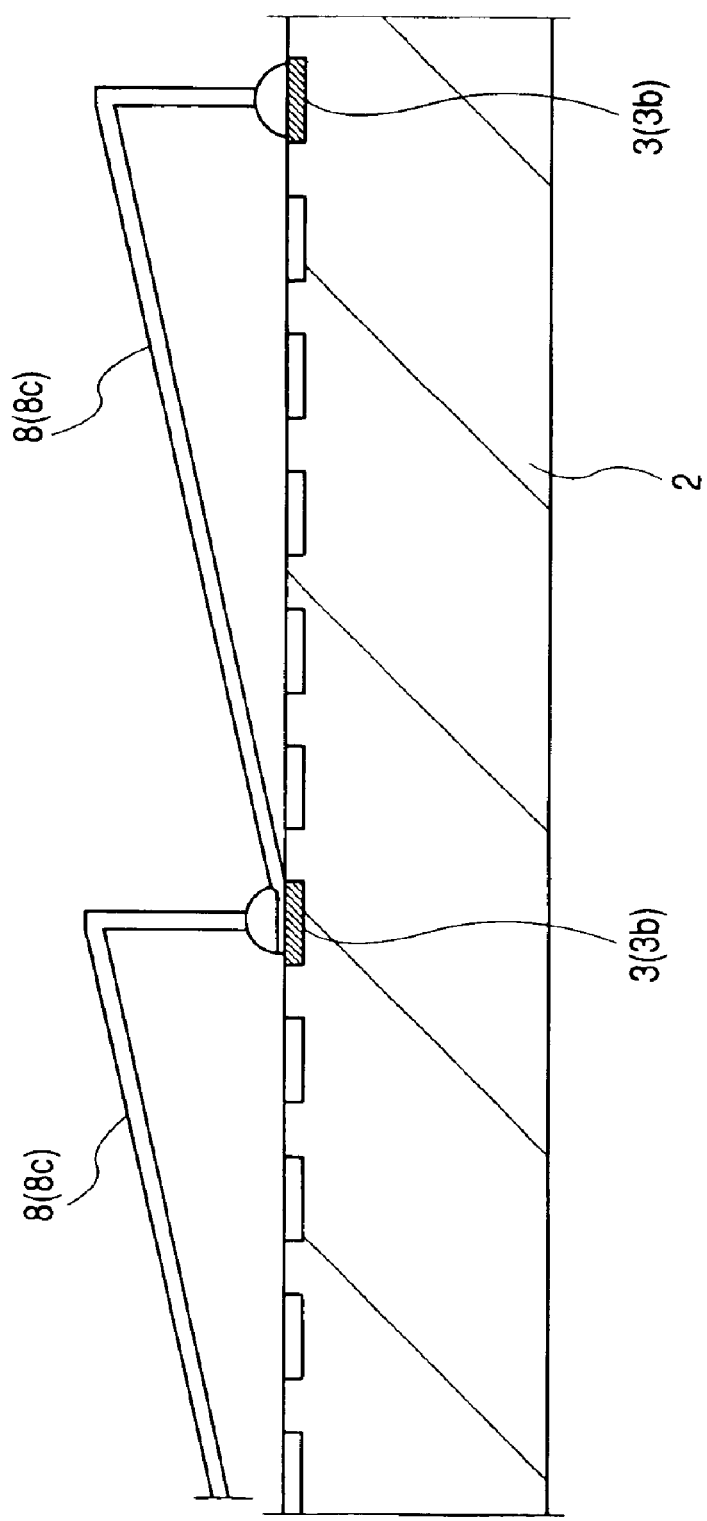
FIG. 6 is a cross-sectional view showing the connection state of the bonding wires in FIG. 5.

The plurality of power source bonding pads 3b are, as shown in FIG. 4 and FIG. 5, connected in series by the bonding wire 8c using the arbitrary power source bonding pad 3b to which the bonding wire 8b is connected as a starting point. When the plurality of power source bonding pads 3b are connected in series, two bonding wires 8c are connected to other power source bonding pads 3b except for the power source bonding pad 3b of an initial stage and the power source bonding pad 3b of a final stage. In this embodiment 1, as shown in FIG. 6, the connection is performed continuously as follows. A primary side of the bonding wire 8c of the first stage is connected to the power source bonding pad 3b of the first stage (initial stage). A secondary side of the bonding wire 8c of the first stage is connected to the power source bonding pad 3b of the second stage. A primary side of the bonding wire 8c of the second stage is connected to the power source bonding pad 3b of the second stage via the secondary side of the bonding wire 8c of the first stage. Thereafter, a secondary side of the bonding wire 8c of the second stage is connected to the power source bonding pad 3b of the third stage. In this manner, when the plurality of power source bonding pads 3b are connected in series by connecting two bonding wires 8c to one bonding pad 3b using a nail head bonding method, it is possible to reduce the area of the bonding pad 3b by connecting the bonding wire 8c of the rear stage to the power source bonding pad 3b in an overlapped manner by way of the secondary side of the bonding wire 8c of the front stage.

Further, the power source bonding pad 3b may be formed in a laterally elongated rectangular shape having the long sides thereof extend along the side of the semiconductor chip 2. In this case, the number of terminals of the semiconductor chip is reduced compared to the example of the abovementioned longitudinal power source bonding pad 3b. However, due to the application of this embodiment, more leads of the whole package can be reduced compared to the amount of reduction of the number of terminals of the semiconductor chip.

FIG. 12(*a*) and FIG. 12(*b*) are views showing the inner structure of the semiconductor device according to a modification 1 of the embodiment 1 of the present invention, wherein FIG. 12(*a*) is a cross-sectional view along signal lead and FIG. 12(*b*) is a cross-sectional view along power source lead.

In connection with the abovementioned embodiment 1, as shown in FIG. 2(*a*), the explanation was directed to the example in which the signal bonding pads 3a and the signal leads 5a are connected using the bonding wires 8a by the nail head bonding method which performs the primary connection at the signal bonding pads 3a of the semiconductor chip 2 and the secondary connection at the connecting portion of the signal leads 5a. However, as shown in FIG. 12(*a*), the signal bonding pads 3a of the semiconductor chip 2 and the connecting portions of the signal leads 5a may be connected using the bonding wires 8a by a nail head bonding method which performs the primary connection at the signal leads 5a and the secondary connection at the signal bonding pads 3a of the semiconductor chip 2. In this manner, by inversely bonding the bonding wires 8a, the height of the bonding wires 8a above the bonding pads 8a is lowered, and, hence, the distance between the bonding wire 8c and the bonding wires 8a which extend along the arrangement direction of the bonding pads 3 is broadened whereby, when the sealing body 9 is formed by a transfer molding method, it is possible to suppress a drawback that both bonding wires (8c, 8a) are brought into contact with each other due to the movement away of wires at the time of injecting resin.

Figures 13A, 13B:
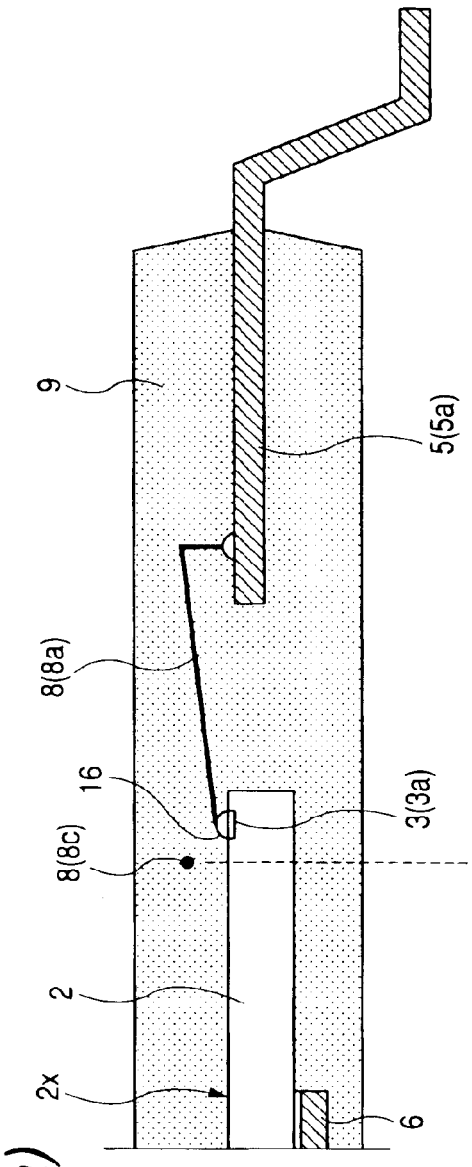

FIG. 13(*a*) and FIG. 13(*b*) are views showing the inner structure of the semiconductor device according to a modification 2 of the embodiment 1 of the present invention, wherein FIG. 13(*a*) is a cross-sectional view along the signal lead and FIG. 13(*b*) is a cross-sectional view along the power source lead.

In the abovementioned modification 1, as shown in FIG. 12(*a*), another end side (secondary side) of the bonding wire 8a is directly connected to the signal bonding pad 3a of the semiconductor chip 2. However, as shown in FIG. 13(*a*), a projection electrode 16 may be formed on the signal bonding pad 3a of the semiconductor chip 2 and the projection electrode 16 may be connected to another side of the bonding wire 8a. The projection electrode 16 may preferably be a stud bump which is formed by a nail head bonding method, for example.

Further, as shown in FIG. 13(*b*), of the plurality of power source bonding pads 3b, a projection electrode 16 may be formed in a first region of the power source bonding pad 3b which is electrically connected with the bonding wire 8b via the lead 5, and another side (secondary side) of the bonding wire 8b may be connected to the projection electrode 16.

When the bonding pad side is set as the secondary side, since the compression bonding method is adopted as the adhesion method, the adhesion strength cannot be ensured; and, further, since the bonding pad and the capillary come close to each other at the time of performing the compression bonding, there exists a possibility that damage to the bonding pad is increased. On the other hand, by adopting the stud bump method, it is possible to reduce damage to the Al pads of the chip and, at the same time, the adhesion strength can be ensured.

Figure 14:
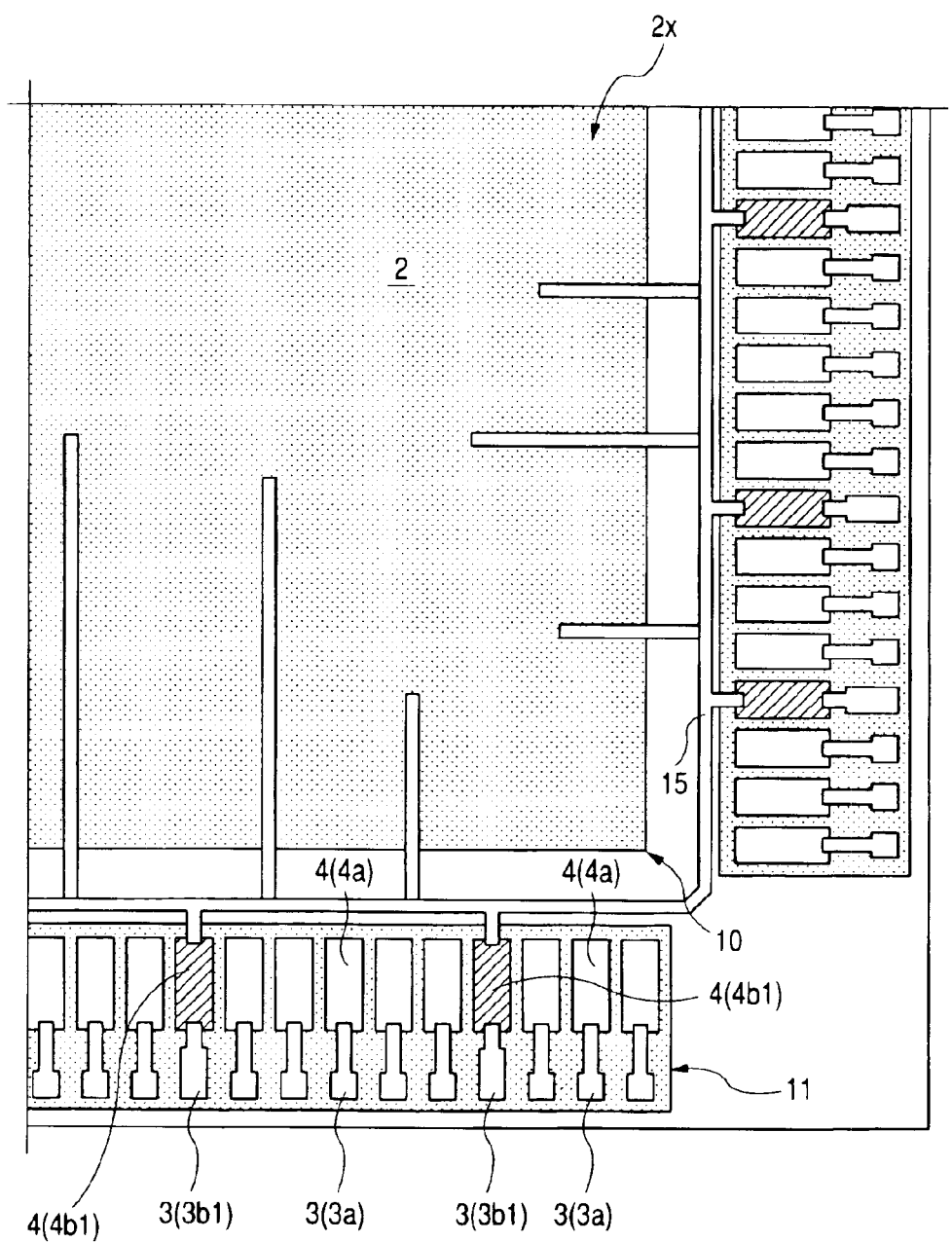
FIG. 14 is a planar layout view of some of the semiconductor chips mounted on the semiconductor device which represents a modification 3 of the embodiment 1 of the present invention.

FIG. 14 is a planar layout view showing some of the semiconductor chips mounted on the semiconductor device which is a modification 3 of the embodiment 1 of the present invention.

As shown in FIG. 14, the plurality of buffer cells 4 include a plurality of power source cells 4b1 and the plurality of bonding pads 3 include a plurality of power source bonding pads 3b1. The plurality of power source cells 4b1 are arranged at locations corresponding to the plurality of power source bonding pads 3b1.

Between the interface circuit forming portions 11 and the internal circuit forming portion 10, a power source line 15 for supplying an operational potential (for example, 1.8V= Vdd) to the internal circuit of the internal circuit forming portion 10, for example, is arranged. The power source line 15 continuously extends in a ring shape such that the power source line 15 surrounds the internal circuit forming portion 10 in a plane.

The power source bonding pads 3b1 are electrically connected with the corresponding power source cells 4b1. Further, the plurality of power source cells 4b1 are electrically connected with the power source line 15, while the power source line 15 is electrically connected with the internal circuit. The power source cells 4b1 are cells for supplying an operational potential necessary for the circuit operation of the internal circuit.

The plurality of power source bonding pads 3b1 are arranged such that the power source bonding pads 3b1 sandwich the plurality of signal bonding pads 3a in a plane for enabling the internal circuit to perform a stable operation.

In connection with the previously-mentioned embodiment 1, the explanation was directed to the example in which the present invention is applied to a plurality of power source pads 3b which supply the operational potential Vcc to the input/output cells 4a. However, as in the case of this modification 3, the present invention may be applicable to the plurality of power source bonding pads 3b1 which supply the operational potential Vdd to the internal circuit. Also in this case, the number of the power source leads can be reduced, and, hence, the semiconductor device can be miniaturized.

Figure 34A:
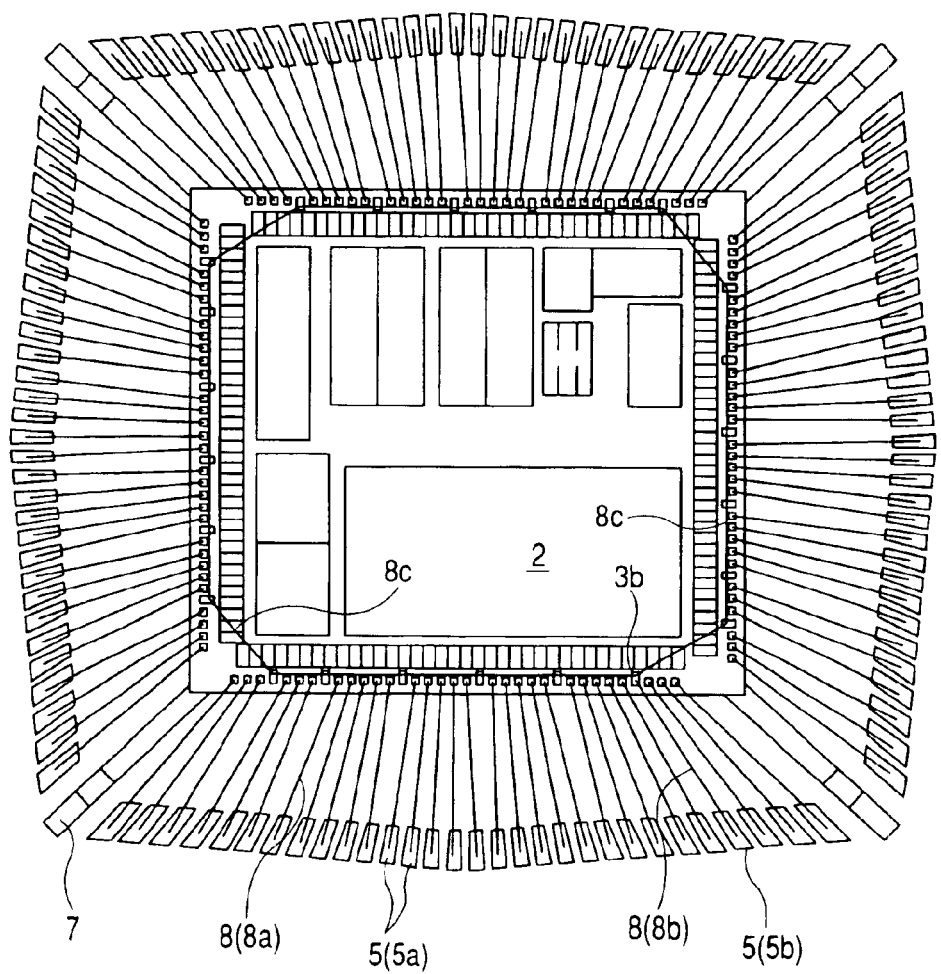
Figure 34B:
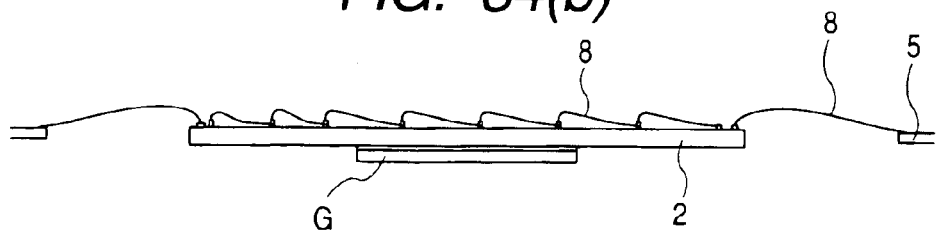

FIG. 34(*a*) and FIG. 34(*b*) are views showing the inner structure of a semiconductor device according to a modification 4 of this embodiment 1 of the present invention, wherein FIG. 34(*a*) is a plan view and FIG. 34(*b*) is a cross-sectional view. As shown in these drawings, the bonding wire 8c may be continuously formed in a closed ring shape.

Embodiment 2

Figure 15A:
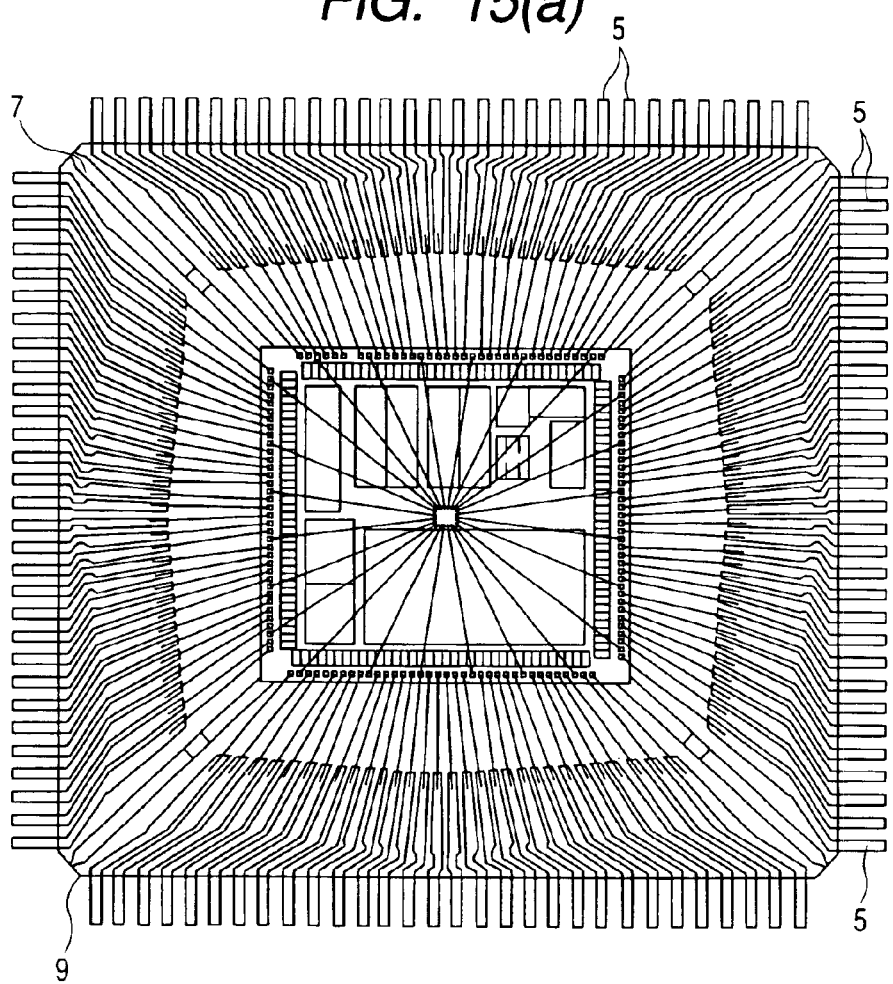
Figure 15B:
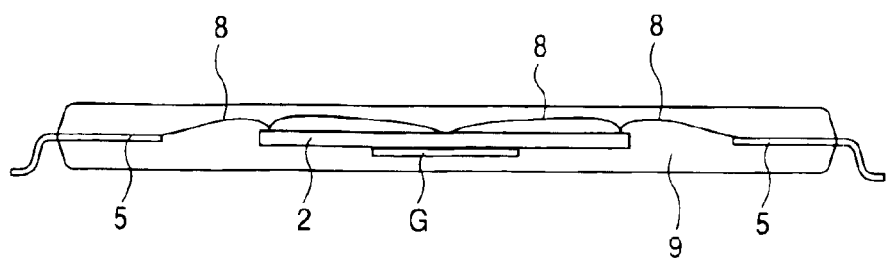

In connection with the abovementioned embodiment 1, the explanation was directed to the example in which the number of the power source leads is reduced using the bonding wires. In this embodiment 2, an explanation will be directed to an example in which the number of the power source leads is reduced using relay bonding pads and bonding wires, with reference to FIGS. 15(*a*) to 22.

Figure 21:
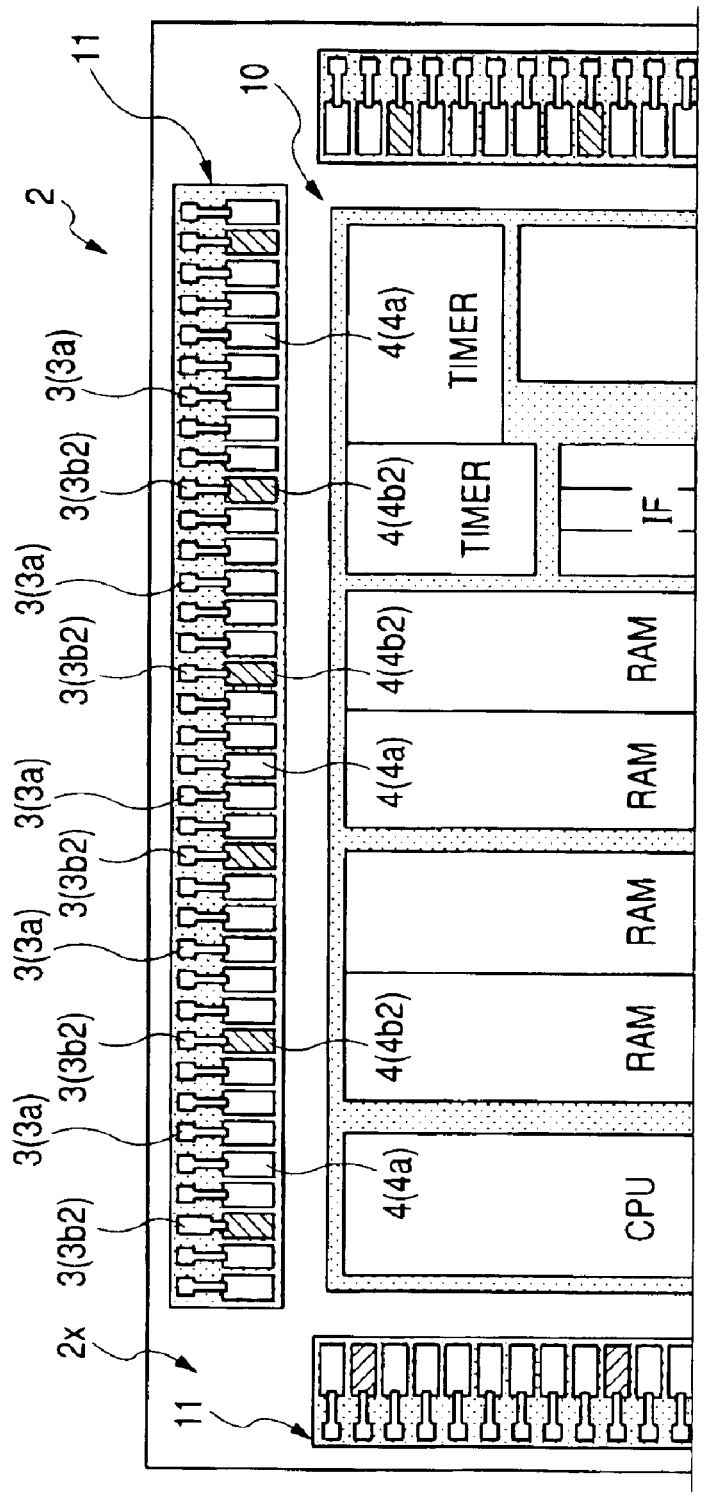
FIG. 21 is a planar layout view showing a portion of FIG. 20 in an enlarged manner.

As shown in FIG. 21, a plurality of buffer cells 4 include a plurality of power source cells 4b2 and a plurality of bonding pads 3 include a plurality of power source bonding pads 3b2. The plurality of power source cells 4b2 are arranged at locations corresponding to the plurality of power source bonding pads 3b2.

Although not shown in the drawing, on an internal circuit forming portion 10, a power source line which supplies an operational potential (for example, 0V=Vss) to a plurality of input/output cells 4a, for example, is arranged. This power source line extends in a ring-like shape such that the power source line surrounds the internal circuit forming portion 10 in a plane.

The power source bonding pads 3b2 are electrically connected with the corresponding power source cells 4b2. Further, the plurality of power source cells 4b2 are electrically connected with the abovementioned power source line. The power source line is electrically connected with the plurality of input/output cells 4a. The power source cells 4b2 are cells for supplying an operational potential necessary for a circuit operation of the input/output cells 4a.

The plurality of power source bonding pads 3b2 are arranged such that the power source bonding pads 3b2 sandwich a plurality of signal bonding pads 3a in a plane for enabling the plurality of input/output cells 4a to perform a stable operation.

Figure 20:
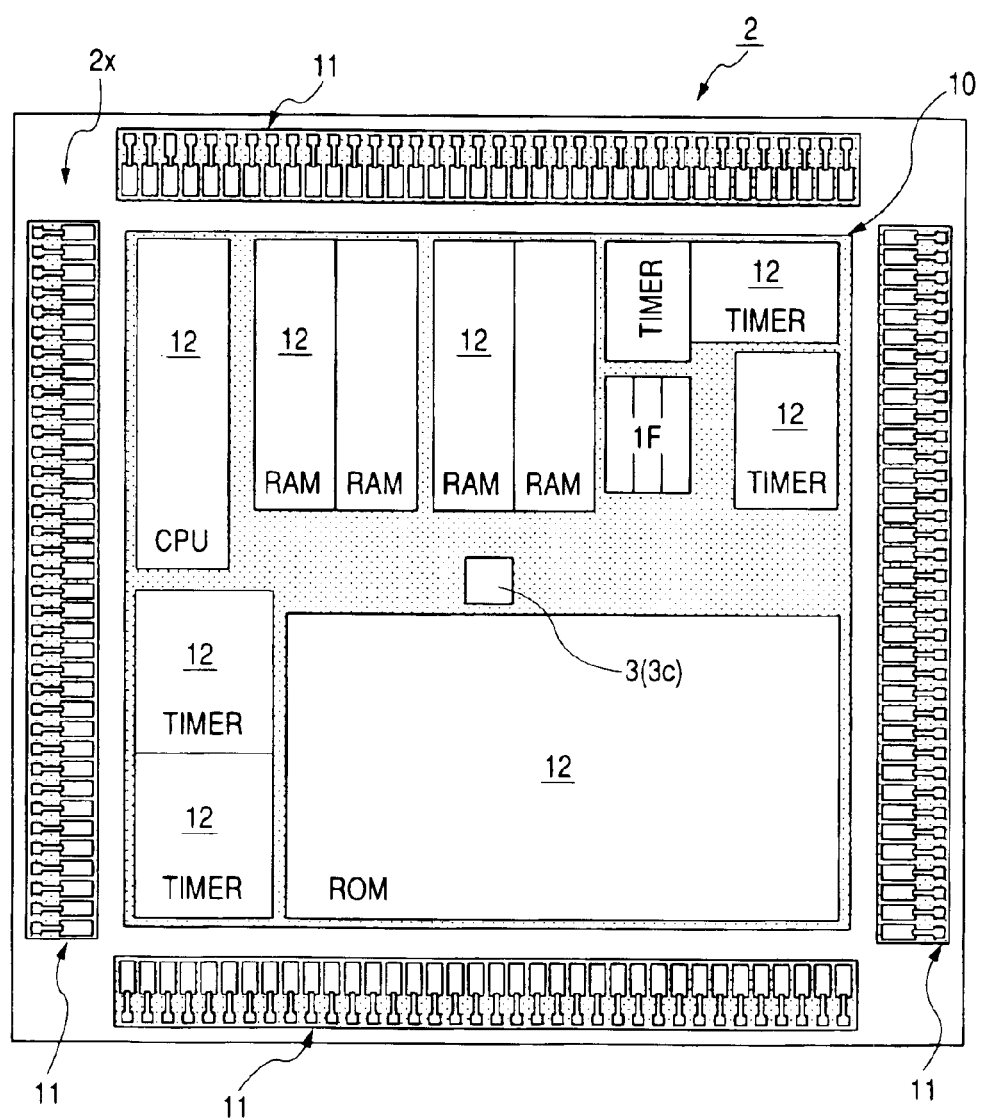
FIG. 20 is a planar layout view of a semiconductor chip shown in FIG. 15(a)

As shown in FIG. 20 and FIG. 21, on a main surface 2x of the semiconductor chip 2, a relay pad 3c is arranged. The relay pad 3c is arranged in a channel forming region 13 defined between circuit blocks 12 and, at the same time, on a region where transistor dies are not formed, that is, on an element separation insulation film (field insulation film) 21. In this embodiment 2, the relay pad 3c is arranged in the vicinity of a center point where two diagonal lines of the semiconductor chip 2 cross each other, for example.

As shown in FIG. 16(a) to FIG. 19, the plurality of leads 5 include a plurality of signal leads 5a and, further, include one power source lead 5b2 to which an operational potential Vss of 0[V], for example, is applied. The plurality of bonding wires 8 include a plurality of bonding wires 8a which respectively electrically connect the plurality of signal bonding pads 3a of the semiconductor chip 2 and the plurality of signal leads 5a respectively. The plurality of bonding wires 8 further include the bonding wire 8b2 which electrically connects the arbitrary power source bonding pad 3b2 of the plurality of power source bonding pads 3b2 of the semiconductor chip 2 with the power source lead 5b2. The plurality of bonding wires 8 further include a plurality of bonding wires 8d which electrically connect the power source bonding pads 3b2 having the same function of the semiconductor chip 2 with the relay pad (relay bonding pad) 3c.

Figure 18:
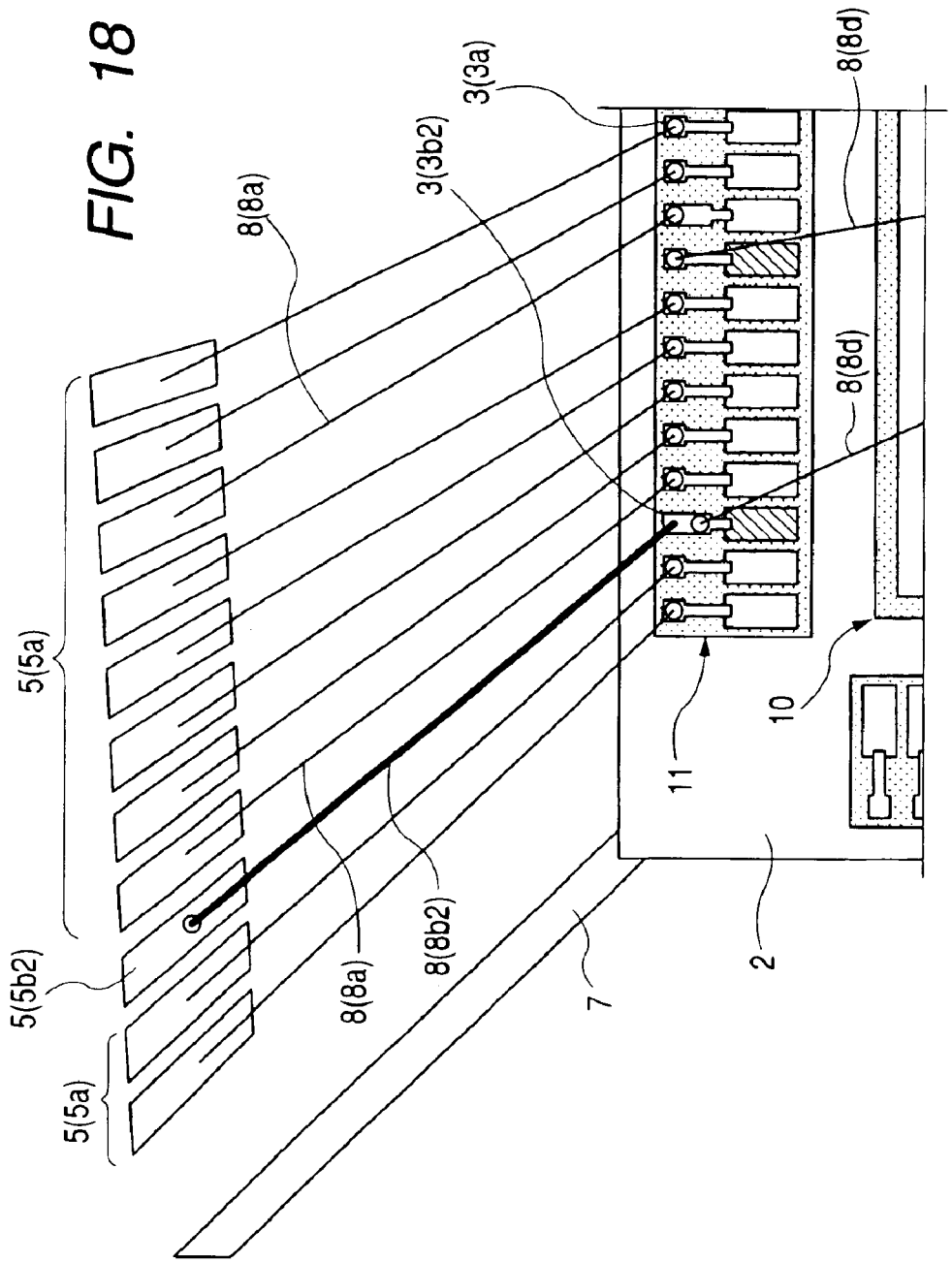
FIG. 18 is a plan view showing a portion of FIG. 17 in an enlarged manner.
Figure 19:
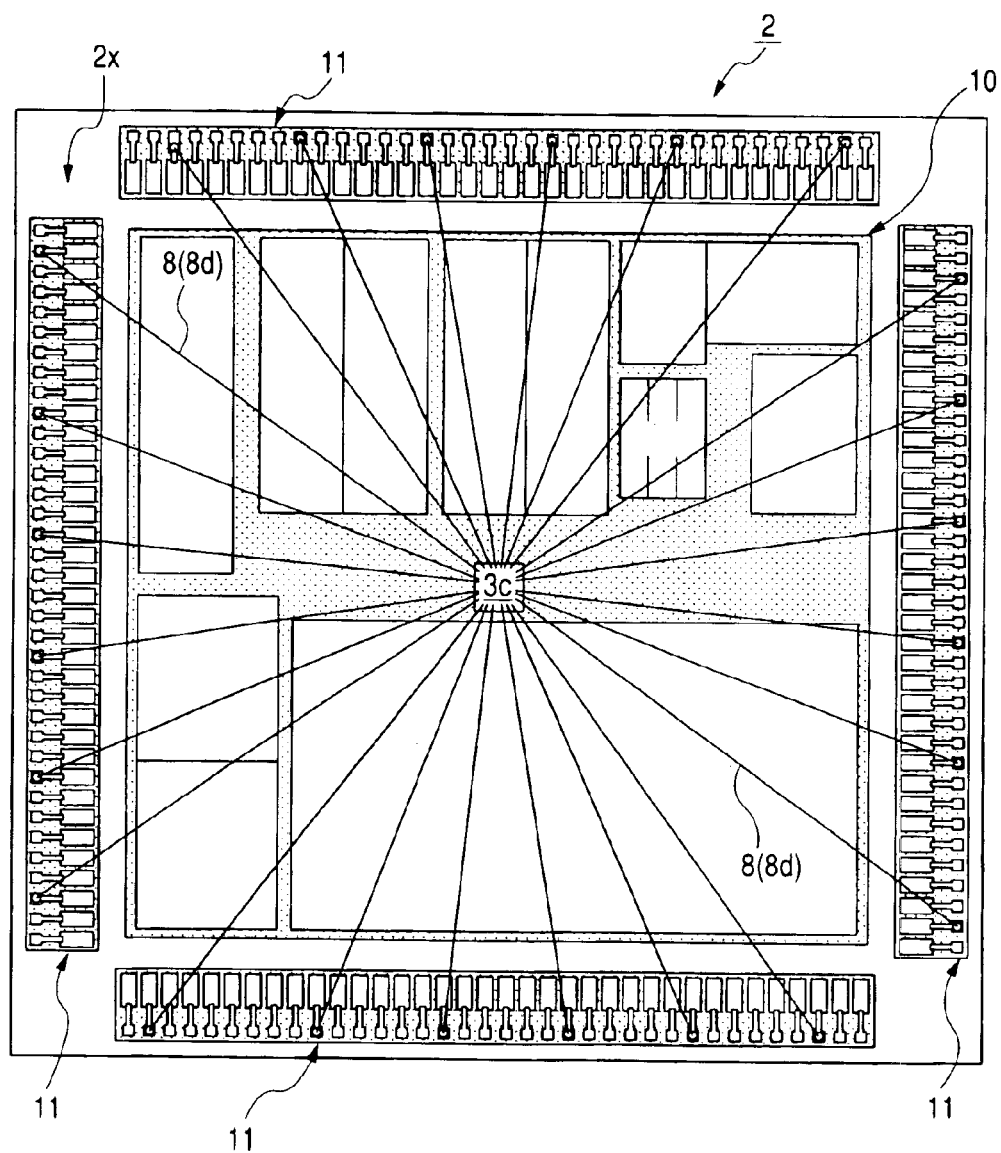
FIG. 19 is a plan view showing a portion of FIG. 17 in an enlarged manner.

As shown in FIG. 18 and FIG. 19, arbitrary power source bonding pads 3b2 of the plurality of power source bonding pads 3b2 are electrically connected with the power source leads 5b2 via the bonding wires 8b2, while the plurality of power source bonding pads 3b2 which include these arbitrary power source bonding pads 3b2 are electrically connected with the relay pad 3c via the bonding wires 8d. Due to such a constitution, except for the arbitrary power source bonding pads 3b2, the number of power source leads 5b2 can be reduced by an amount corresponding to the number of the power source bonding pads 3b2 which are electrically connected with the relay pad 3c via the bonding wires 8d, and, hence, the miniaturization of the semiconductor device can be realized. According to this embodiment 2, for example, while 24 power source bonding pads 3b2 are provided, one power source lead 5b2 is connected with one of the power source bonding pads 3b2 via the bonding wires 8b2, and, hence, 23 power source leads 5b2 can be eliminated.

Figure 16A:
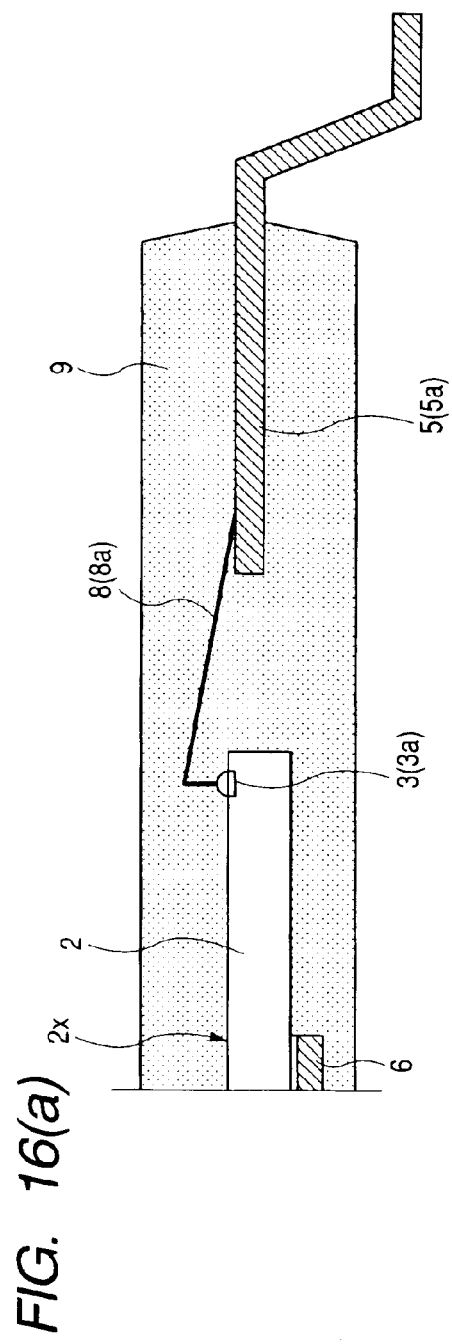

The bonding wires 8a are, as shown in FIG. 16(a), connected by a nail head bonding (ball bonding) method which performs the primary connection at the signal bonding pads 3a of the semiconductor chip 2 and performs the secondary connection at the signal leads 5a.

The bonding wires 8b2 are, as shown in FIG. 18, connected by a nail head bonding (ball bonding) method which performs the primary connection at the power source leads 5b2 and performs the secondary connection at the power source bonding pads 3b2 of the semiconductor chip 2.

Figure 16B:
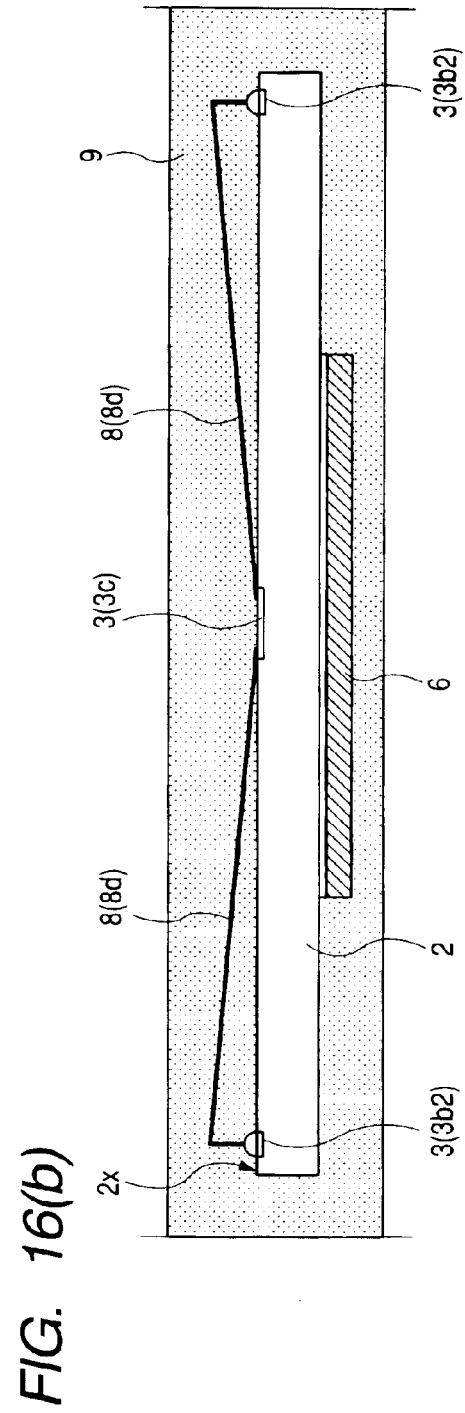
Figure 17:
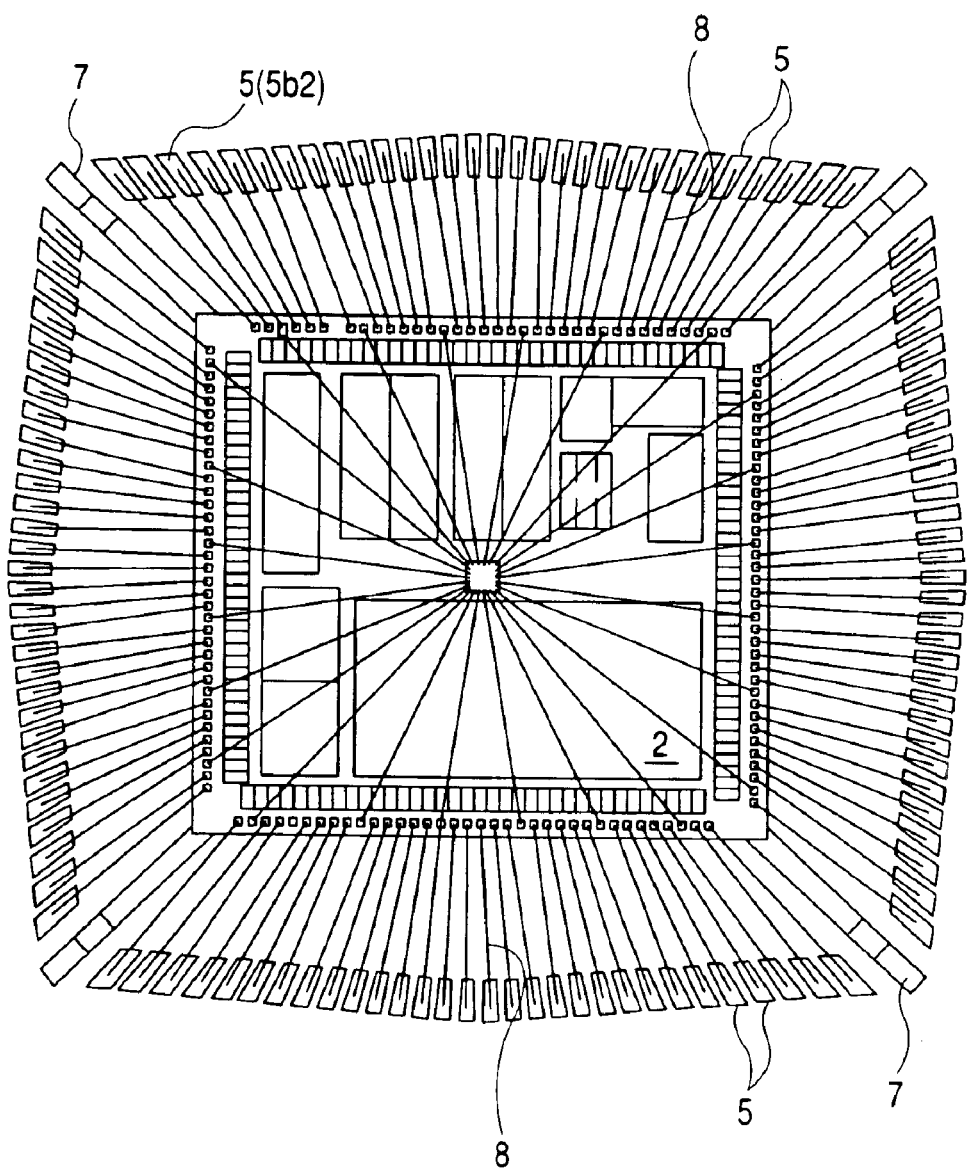
FIG. 17 is a plan view showing a portion of FIG. 15(a) in an enlarged manner.

The bonding wires 8d are, as shown in FIG. 16(b), connected by a nail head bonding method which performs the primary connection at the power source bonding pads 3b2 with the secondary connection at the relay pad 3c. In this manner, by performing the wire connection between the power source bonding pads 3b2 and the relay pads 3c by the nail head bonding method which performs the primary connection at the power source bonding pads 3b2 and the secondary connection at the relay pad 3c, the height of the bonding wires 8d on the relay pad 3c can be lowered, and, hence, the distance between a capillary at the time of connecting the bonding wires 8d to the relay pad 3c and the bonding wires 3d which are already connected can be broadened. As a result, compared to a case in which the relay pad 3c and the power source bonding pads 3b2 are connected using wires by the nail head bonding method which performs the primary connection at the relay pad 3c and the secondary connection at the power source bonding pads 3b2, the area of the relay pad 3c can be reduced. Accordingly, it is possible to easily arrange the relay pad 3c without increasing the size of the semiconductor chip 2 and without a restriction on the designing. Further, the plurality of bonding wires 8d can be connected to the relay pad 3c in a concentrated manner with a small area.

The relay pad 3c is arranged in a wiring channel region 13 in which a transistor die which constitutes a circuit is not formed. Due to such a constitution, it is possible to suppress the occurrence of a defect attributed to impacts which the semiconductor device receives at the time of connecting the bonding wires 8d to the relay pad 3c.

Embodiment 3

This embodiment 3 is directed to an example in which the number of leads is reduced by the combination of the abovementioned embodiments 1 and 2.

Figure 23A:
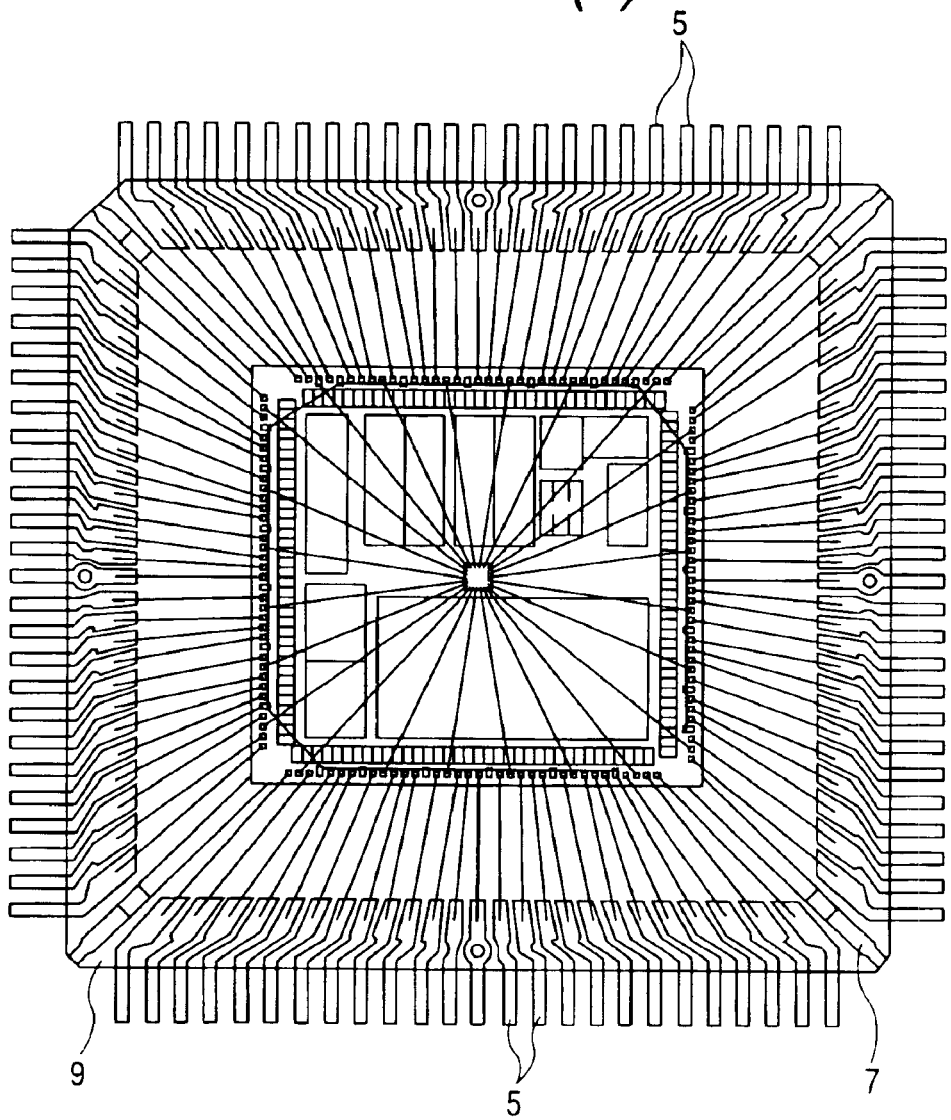
FIG. 23(a) is a plan view and FIG. 23(b) is a cross-sectional view.
Figure 23B:
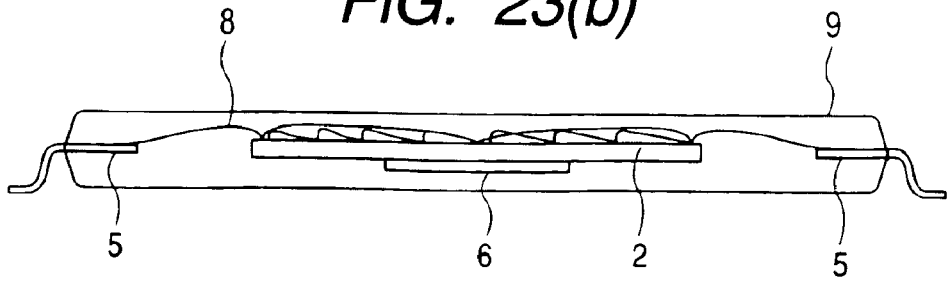

FIG. 23(a) and FIG. 23(b) show the inner structure of a semiconductor device according to an embodiment 3 of the present invention, wherein FIG. 23(a) is a plan view and FIG. 23(b) is a cross-sectional view.

As shown, the wire connection between bonding pads to which an operational potential (power source potential) Vcc is applied is established using the abovementioned embodiment 1 and the wire connection between bonding pads to which an operational potential (power source potential) Vss is applied is established using the abovementioned embodiment 2. In this manner, due to the combination of the abovementioned embodiments 1 and 2, the number of power source leads of two systems can be reduced, and, hence, it is possible to realize further miniaturization of the semiconductor device.

Embodiment 4

This embodiment 4 is directed to an example in which the number of leads is reduced by combining the abovementioned embodiment 1 and a bus bar lead.

Figure 24A:
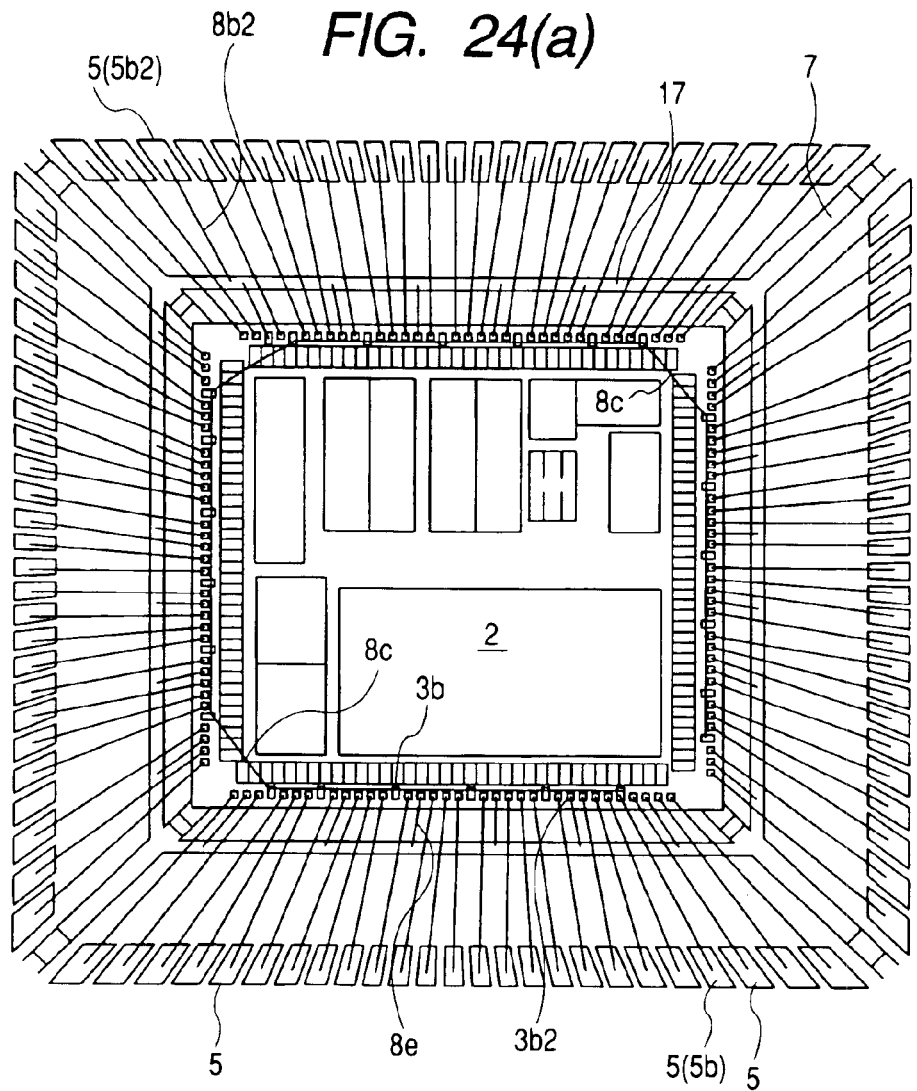
Figure 24B:
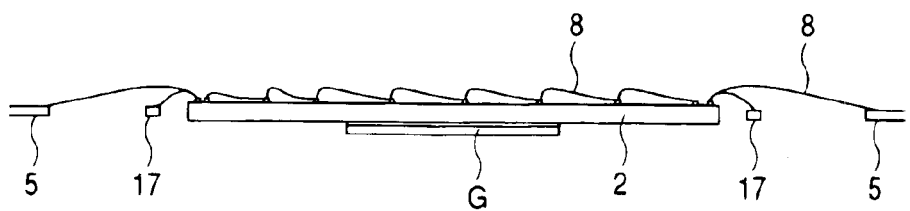

FIG. 24(a) and FIG. 24(b) show the inner structure of a semiconductor device according to an embodiment 4 of the present invention, wherein FIG. 24(a) is a plan view and FIG. 24(b) is a cross-sectional view.

The semiconductor device of this embodiment 4 is configured to include a bus bar lead 17. The bus bar lead 17 is arranged between sides of a semiconductor chip 2 and one-end portions of a plurality of leads 5 and, at the same time, along the sides of the semiconductor chip 2. In this embodiment 4, the bus bar lead 17 is arranged along four sides of the semiconductor chip 2 and is integrally connected with four suspending leads 7. Further, the bus bar lead 17 is arranged to be connected with four suspending leads 7 in a region outside the semiconductor chip 2.

On the semiconductor chip 2, a plurality of power source pads 3b are electrically connected with power source leads 5b to which an operational potential Vcc (for example, 3.3V) is applied by adopting a wire connection which is substantially equal to the wire connection adopted by the abovementioned embodiment 1.

The bus bar lead 17 is electrically connected with power source leads 5b2 to which an operational potential Vss (for example, 0V) which is lower than the operational potential Vcc is supplied using bonding wires 8b2.

A plurality of power source bonding pads 3b2 to which the operational potential Vss is supplied are electrically connected with the bus bar lead 17 by a plurality of bonding wires 8e.

In this manner, by electrically connecting the plurality of power source bonding pads 3b with power source leads 5b2 to which the operational potential Vcc is supplied using a wire connection substantially equal to the wire connection adopted by the abovementioned embodiment 1, by electrically connecting the bus bar lead 17 with the power source leads 5b2 to which the operational potential Vss which is lower than the operational potential Vcc is supplied using bonding wires 8b2, and by electrically connecting the plurality of power source bonding pads 3b2 with the bus bar lead 17 using the plurality of bonding wires 8e, it is possible to reduce the number of power source leads of two systems in the same manner as the previously-mentioned embodiment 3, and, hence, it is possible to realize further miniaturization of the semiconductor device.

Figure 35A:
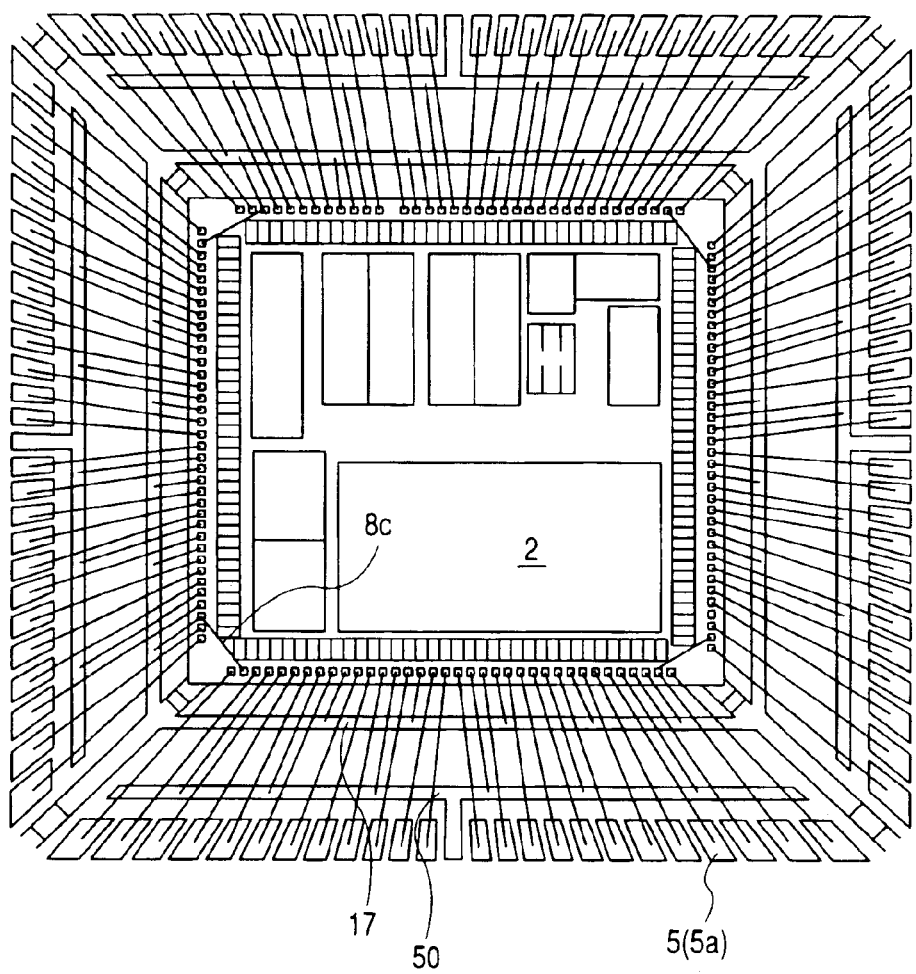
Figure 35B:
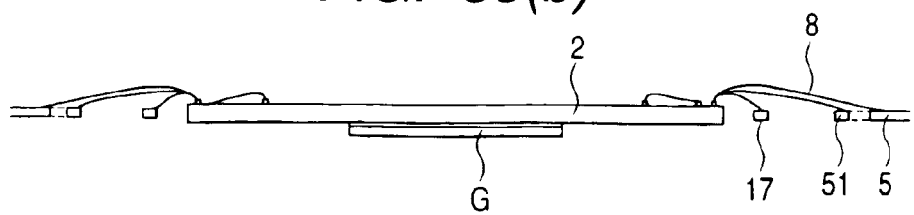

Here, as shown in FIG. 35(a) and FIG. 35(b), another bus bar lead 50 may be formed besides the bus bar lead 17. In this case, another bus bar lead 50 is integrally formed with the selected leads 5 and an operational potential Vss is supplied to the bus bar lead 50 from the outside.

Embodiment 5

In connection with embodiment 5, the following explanation will be directed to an example in which the invention is applied to a QFN (Quad Flatpack Non-leaded Package) type semiconductor device.

Figure 25A:
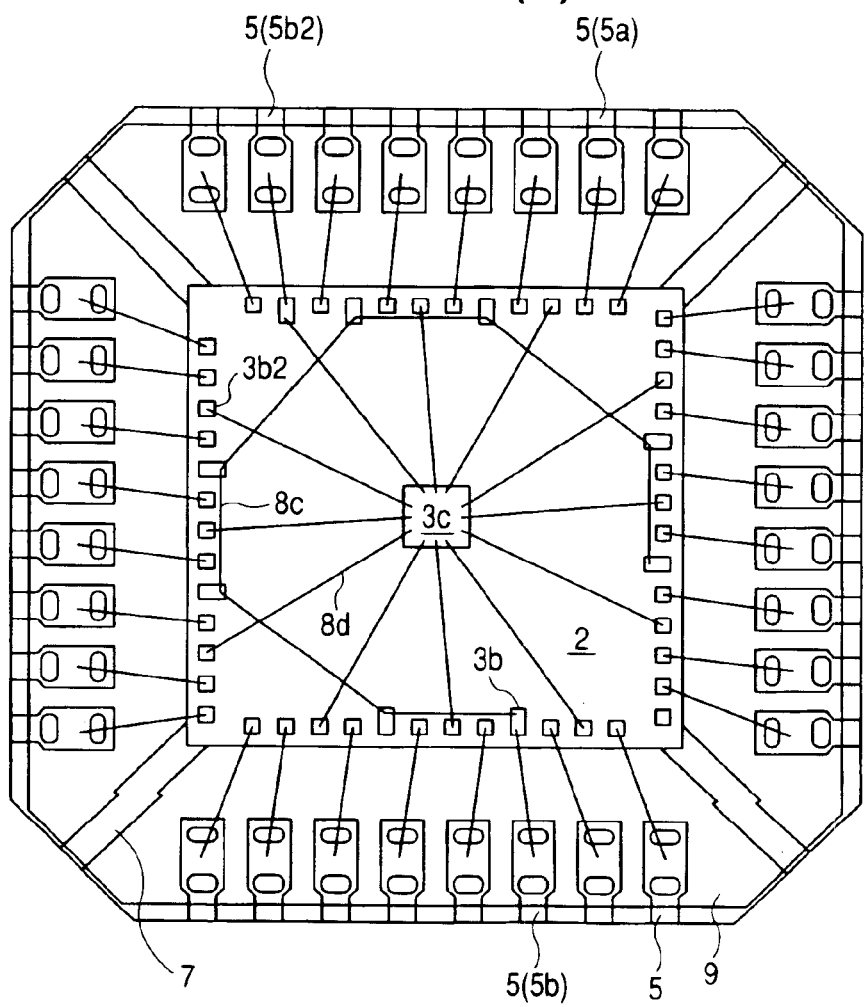
Figure 25B:
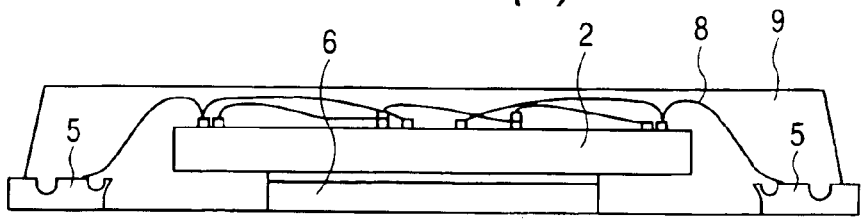

FIG. 25(a) and FIG. 25(b) show the inner structure of the semiconductor device according to the embodiment 5 of the present invention, wherein FIG. 25(a) is a plan view and FIG. 25(b) is a cross-sectional view.

The semiconductor device of the embodiment 5 is configured such that a plurality of leads 5 are exposed from a back surface of the sealing body 9.

A plurality of power source bonding pads 3b of the semiconductor chip 2 adopt a wire connection that is substantially equal to the wire connection of the abovementioned embodiment 1, wherein the power source bonding pads 3b are electrically connected with power source leads 5b to which a Vcc operational potential (for example, 3.3V) is supplied.

A plurality of power source bonding pads 3b2 of the semiconductor chip 2 adopt a wire connection substantially equal to the wire connection of the abovementioned embodiment 2, wherein the power source bonding pads 3b2 are electrically connected with power source leads 5b2 to which an operational potential Vss (for example, 0V) is supplied.

In this manner, the plurality of power source bonding pads 3b are electrically connected with the power source leads 5b to which the operational potential Vcc is supplied using a wire connection that is substantially equal to the wire connection of the abovementioned embodiment 1, and the plurality of power source bonding pads 3b2 are electrically connected with the power source leads 5b2 to which the operational potential Vss which is lower than the operational potential Vcc is supplied using a wire connection that is substantially equal to the wire connection of the abovementioned embodiment 2, and, hence, also with respect to the QFN type semiconductor device, the number of the power source leads can be reduced and the semiconductor device can be miniaturized.

Here, the explanation is directed to an example which uses the lead frame which is half-etched such that the tabs have a thickness which is 50% of the thickness of the frame. However, even with respect to the QFN type semiconductor device which uses the tab elevating structure or the tab exposing structure, it is possible to reduce the number of the power source leads in the same manner whereby the miniaturization of the semiconductor device be realized.

Embodiment 6

In connection with embodiment 6, the following explanation will be directed to an example in which the present invention is applied to a BGA (Ball Grid Array) type semiconductor device.

Figure 26A:
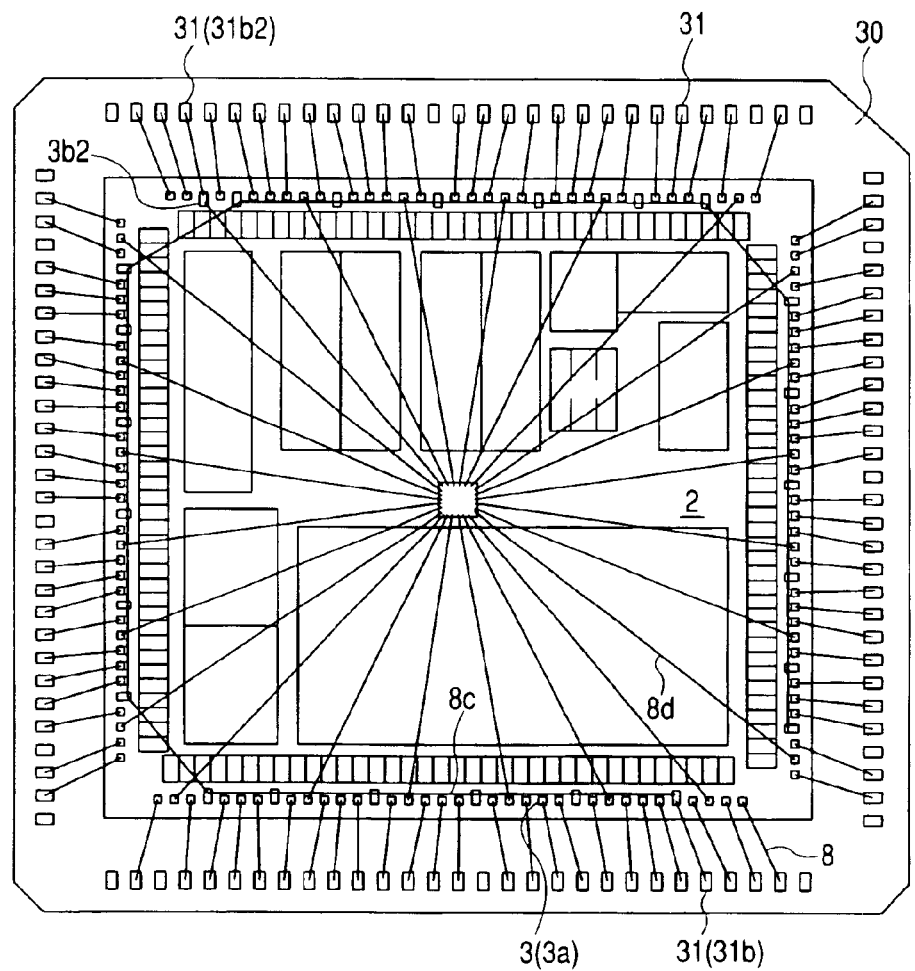
Figure 26B:
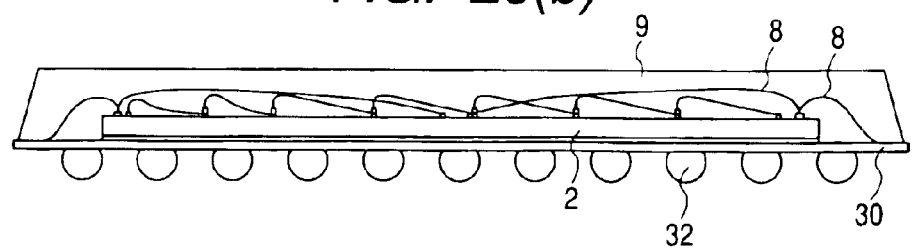

FIG. 26(a) and FIG. 26(b) show the inner structure of the semiconductor device according to the embodiment 6 of the present invention, wherein FIG. 26(a) is a plan view and FIG. 26(b) is a cross-sectional view.

The semiconductor device of the embodiment 6 is configured, as shown, such that the semiconductor device mainly includes a semiconductor chip 2, a plurality of bonding wires 8, a printed wiring circuit board 30, a plurality of projection-like electrodes (bump electrodes) 32 which are used as external connection terminals and the like. The semiconductor chip 2 is adhered to and is fixed to the main surface of the printed wiring circuit board 30 by interposing an adhesive material therebetween. A plurality of projection-like electrodes 32 are arranged in a matrix array on a back surface opposite to the main surface of the printed wiring circuit board 30.

A plurality of connecting portions 31 are arranged in the periphery of the semiconductor chip 2. The plurality of connecting portions 31 are constituted of portions of lines of the printed wiring circuit board 30, and the plurality of connecting portions 31 are arranged corresponding to a plurality of bonding pads 3 of the semiconductor chip 2.

The plurality of connecting portions 31 are respectively electrically connected with projection-like electrodes 32 via lines of the printed wiring circuit board 30. The plurality of connecting portions 31 include a plurality of signal connecting portions, a power source connecting portion 31b, and a power source connecting portion 31b2.

A plurality of signal bonding pads 3a of the semiconductor chip 2 are electrically connected with a plurality of signal connecting portions of the printed wiring circuit board 30 via the bonding wires 8.

A plurality of power source bonding pads 3b of the semiconductor chip 2 adopt a wire connection that is substantially equal to the wire connection of the abovementioned embodiment 1, wherein the power source bonding pads 3b are electrically connected with the power source connecting portion 31b to which an operational potential Vcc (for example, 3.3V) is supplied.

A plurality of power source bonding pads 3b2 of the semiconductor chip 2 adopt a wire connection that is substantially equal to the wire connection of the abovementioned embodiment 2, wherein the power source bonding pads 3b2 are electrically connected with the power source connecting portion 31b2 to which an operational potential Vss (for example, 0V) is supplied.

The semiconductor chip 2, a plurality of bonding wires 8 and the like are sealed by a sealing body 9 which selectively covers a main surface of the printed wiring circuit board 30. The sealing body 9 is formed using a single surface molding technique.

In this manner, a plurality of power source bonding pads 3b are electrically connected with the power source connecting portion 31b to which the operational potential Vcc is supplied using a wire connection that is substantially equal to the wire connection of the abovementioned embodiment 1, and the plurality of power source bonding pads 3b2 are electrically connected with the power source connecting portion 31b2 to which the operational potential Vss which is lower than the operational potential Vcc is supplied using a wire connection that is substantially equal to the wire connection of the abovementioned embodiment 2; and, hence, the number of the power source connecting portions (31b, 31b2) can be reduced, whereby the miniaturization of the printed wiring circuit board 30 can be realized, and, at the same time, miniaturization of the semiconductor device can be realized.

Further, even when the present invention is applied to a semiconductor device without regard to a reduction of the size of the semiconductor device, it is possible to widen the pitch of solder bowls 32 which constitute the external terminals. Accordingly, narrowing of the pitch of the printed wiring circuit board (mounting board) for mounting the package can be alleviated, and, hence, mounting of the package on the printed wiring circuit board is facilitated. Further, the width of wiring formed on the printed wiring circuit board 30 can be increased, and, hence, the reliability of the package can be enhanced.

Figure 36A:
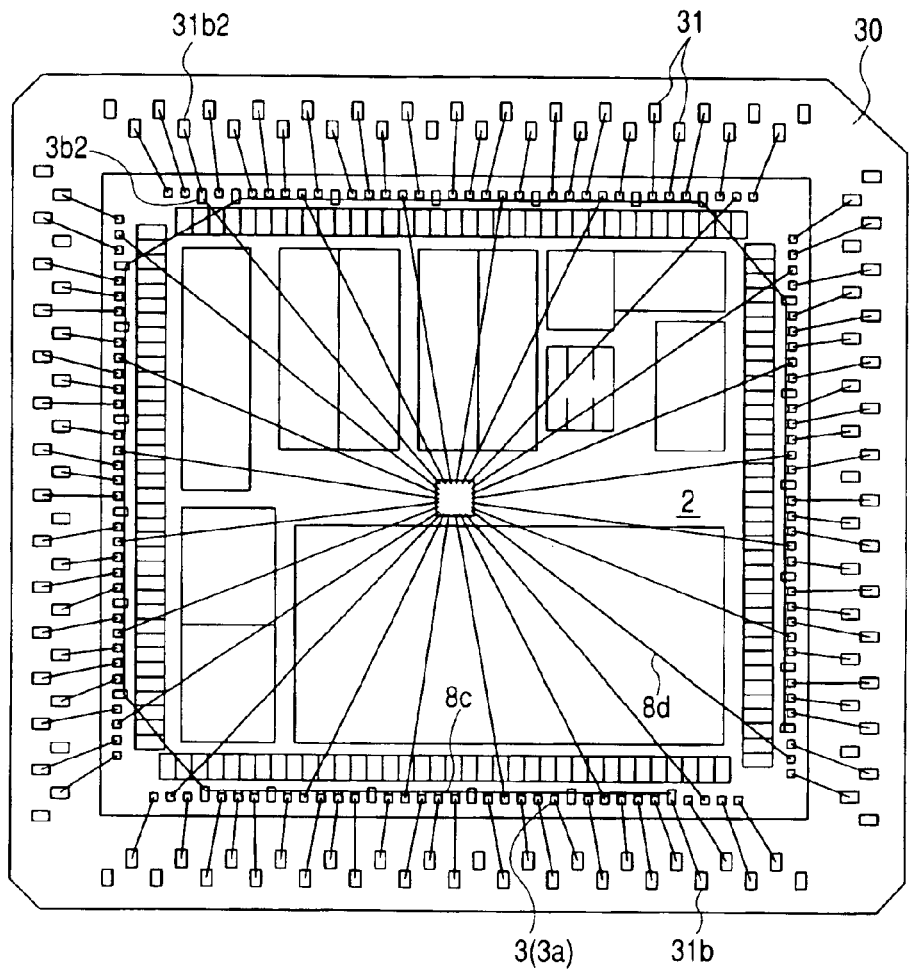
Figure 36B:
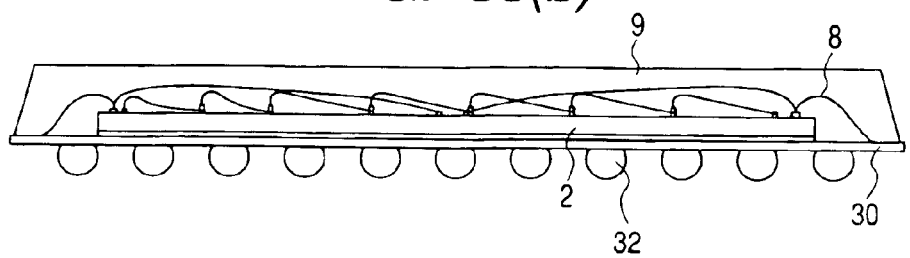

Further, as shown in FIG. 36(a) and FIG. 36(b), a plurality of connecting portions 31 may be arranged in a staggered pattern. In this case, the interval of a plurality of neighboring connecting portions 31 can be reduced compared to the embodiment shown in FIG. 26, and, hence, the planner size of the wiring board 30 can be reduced, whereby the miniaturization of the package can be realized correspondingly. Further, the power source connecting portion 31b2 can be arranged close to (inside) the semiconductor chip and the length of the bonding wires to be connected is arranged to become short.

Figure 37A:
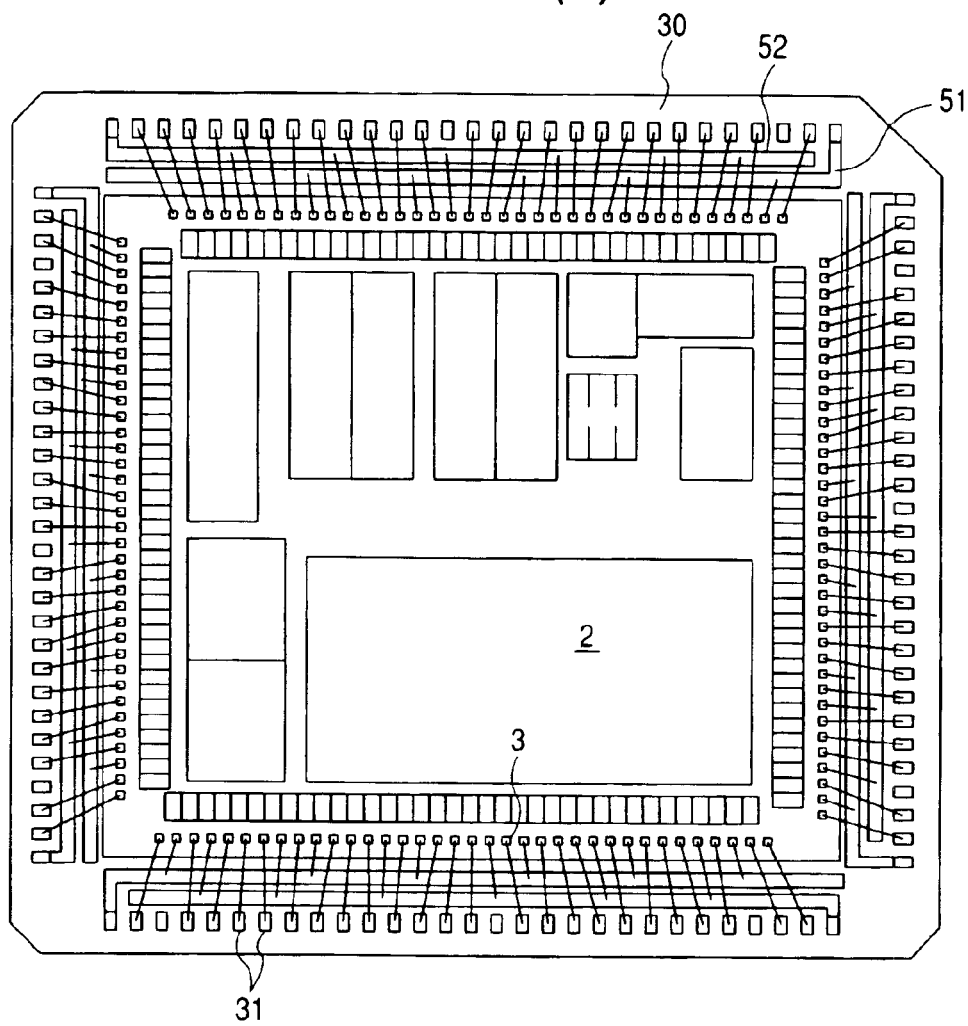
Figure 37B:
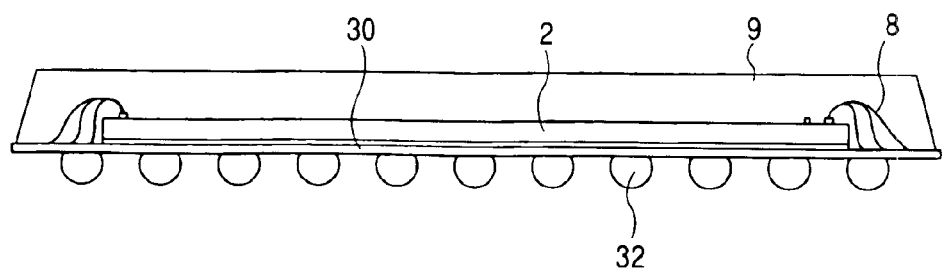

Further, as shown in FIG. 37(a) and FIG. 37(b), bus bar lines 51 (operational potential Vss, for example 0V) and bus bar lines 52 (operational potential Vcc, for example 3.3V) may be formed around the semiconductor chip 2, and for the same purpose as the example shown in FIG. 35(a) and FIG. 35(b), the bus bar lines 51 and 52 may be connected with a plurality of corresponding power source bonding pads and a plurality of corresponding power source connecting portions using bonding wires.

Figure 38A:
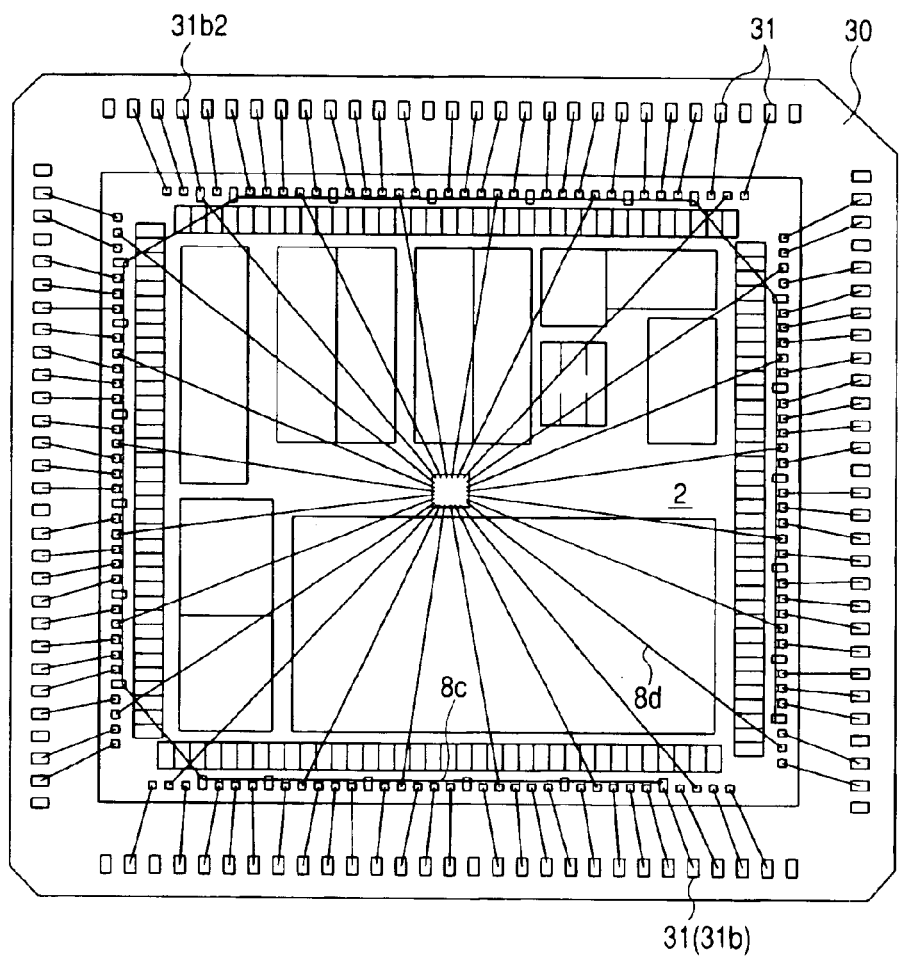
Figure 38B:
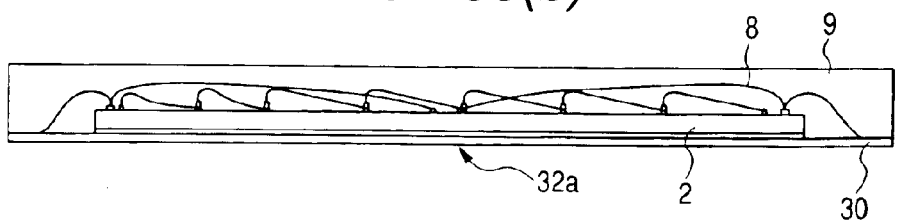

Further, as shown in FIG. 38(a) and FIG. 38(b), the semiconductor device may adopt a structure in which the printed wiring circuit board 30 and the sealing body 9 are formed to have the same size in a plan view and a plurality of projection-like electrodes (bump electrodes) 32 are omitted. Such a structure is obtained by forming the sealing body using a MAP (Multi Arrayed Package) technique (also referred to as a collective molding technique) and, thereafter, by dicing a multi-wiring substrate. Further, the omission of the plurality of projection-like electrodes (bump electrodes) 32 may be compensated by using a background metal layer 32a of a bump electrode forming portion (for example, the Au plating structure on a Cu layer). Such an electrode structure is generally referred to as a LGA (Land Grid Array) structure.

Embodiment 7

In connection with this embodiment 7, the following explanation will be directed to a semiconductor device having a semiconductor chip provided with testing bonding pads with reference to FIGS. 27 to 31.

Figure 29:
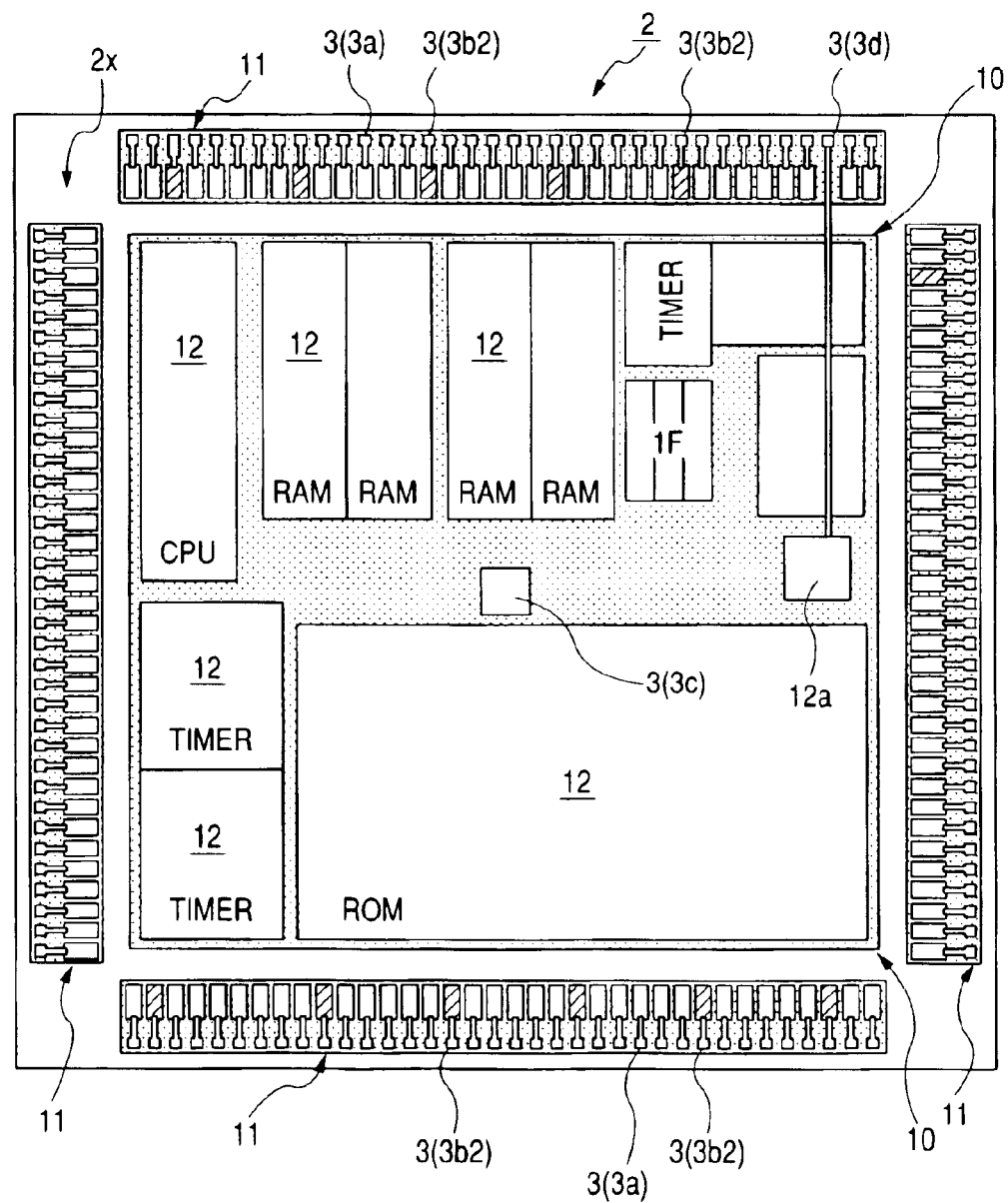
FIG. 29 is a planar layout view of a semiconductor chip shown in FIG. 27.

As shown in FIG. 29, an internal circuit of a semiconductor chip 2 includes a testing circuit 12a for electrically testing functions of the circuit blocks 12. Further, a plurality of bonding pads 3 formed on the semiconductor chip 2 include a testing bonding pad 3d which is electrically connected with the testing circuit 12a via internal wiring of the semiconductor chip 2.

Figure 27:
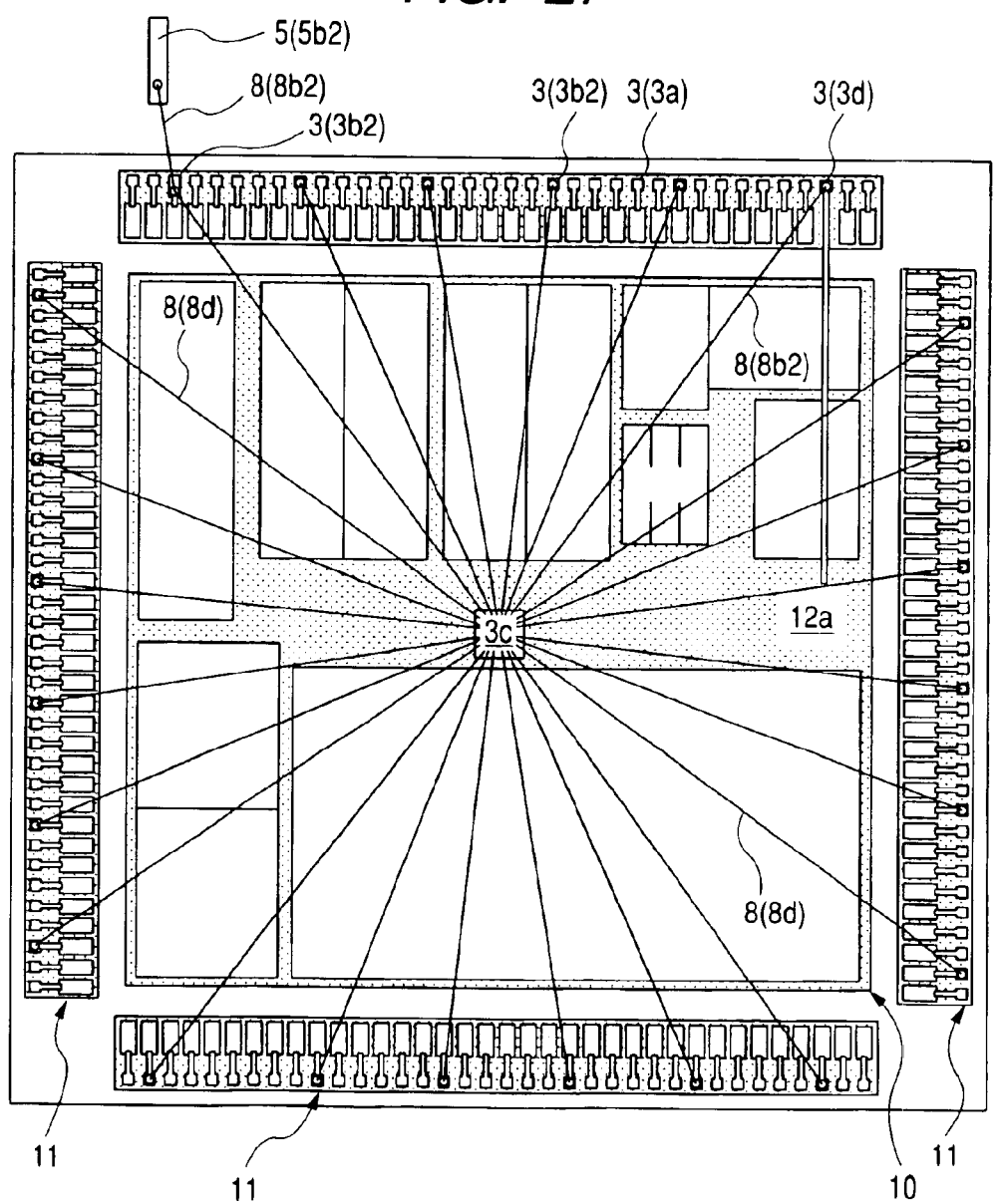
FIG. 27 is a plan view showing the inner structure of a semiconductor device according to an embodiment 7 of the present invention.
Figure 28:
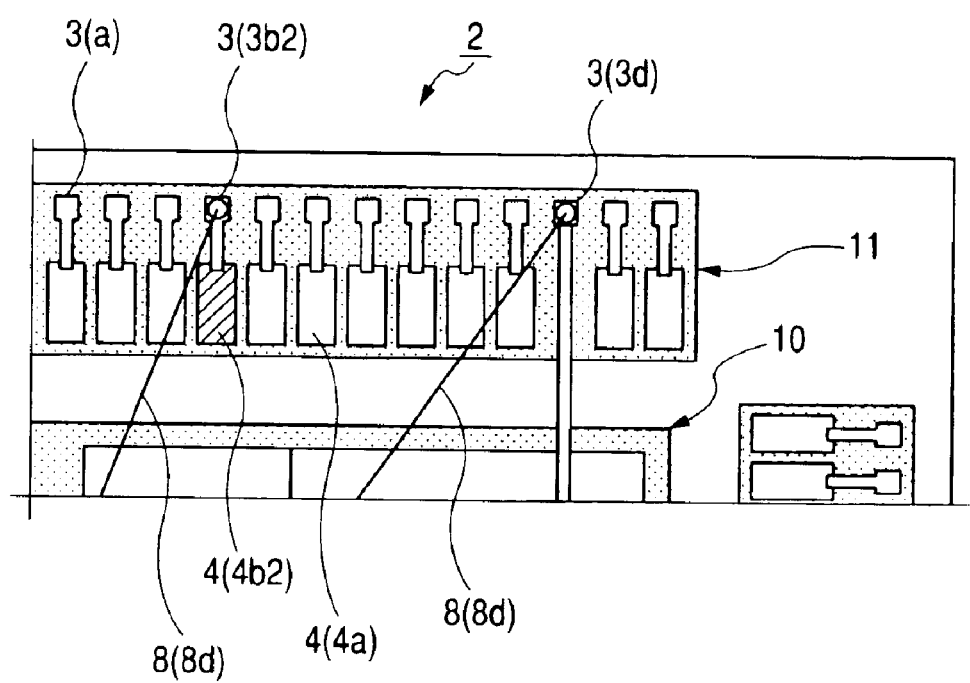
FIG. 28 is a plan view of a portion of FIG. 27 in an enlarged manner.

As shown in FIG. 27 and FIG. 28, the plurality of bonding pads 3 which include the testing bonding pad 3d are electrically connected with the power source leads 5b2 to which an operational potential Vss (for example, 0V) is supplied using a wire connection that is substantially similar to the wire connection used in the previously-mentioned embodiment 2. That is, the operational potential Vss is supplied from the power source lead 5b2 to the testing bonding pad 3d through the bonding wire 8b2, the power source bonding pad 3b2, the bonding wire 8d, the relay pad 3c and the bonding wire 8d.

Figure 30:
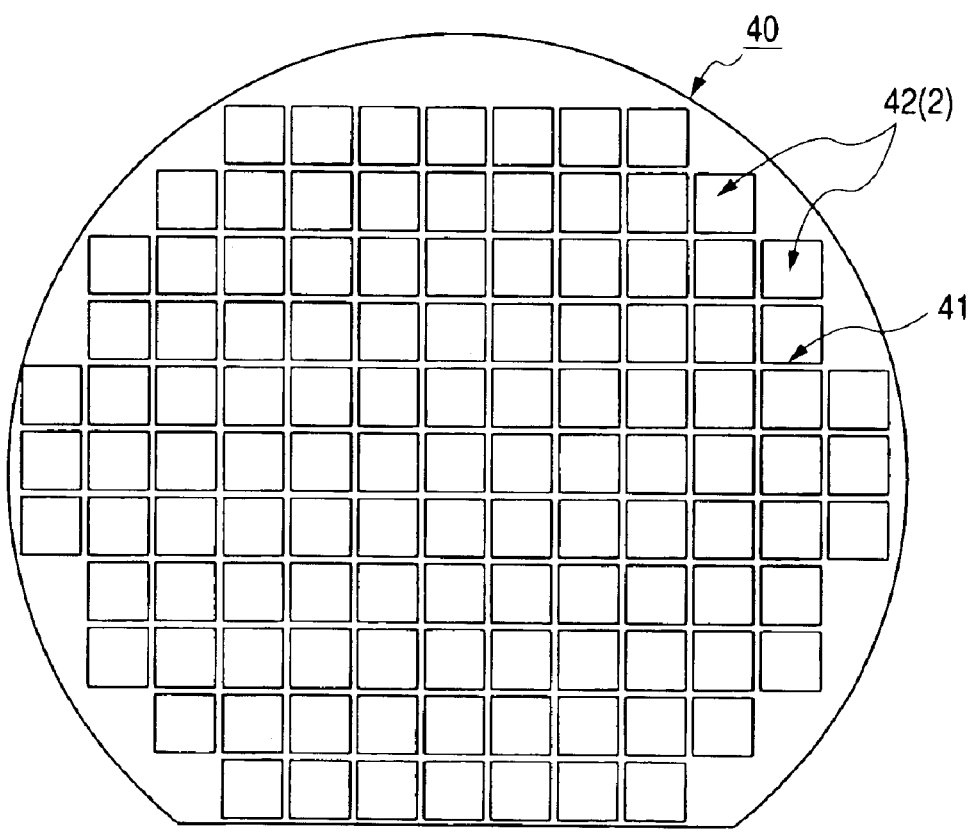
FIG. 30 is a plan view of a semiconductor wafer used in the manufacture of the semiconductor device of the embodiment 7 of the present invention.

The semiconductor chip 2 is formed by dividing a semiconductor wafer 40 shown in FIG. 30 into individual parts in a dicing step during a manufacturing process of the semiconductor device. The semiconductor wafer 40 is configured to have a plurality of chip forming regions 42 defined by scribe lines 41. By dicing the scribe lines 41 thus dividing the semiconductor wafer 40 into a plurality of individual chip forming regions 42, the semiconductor chips 2 each of which is constituted of the chip forming region 42 are formed.

Figure 31:
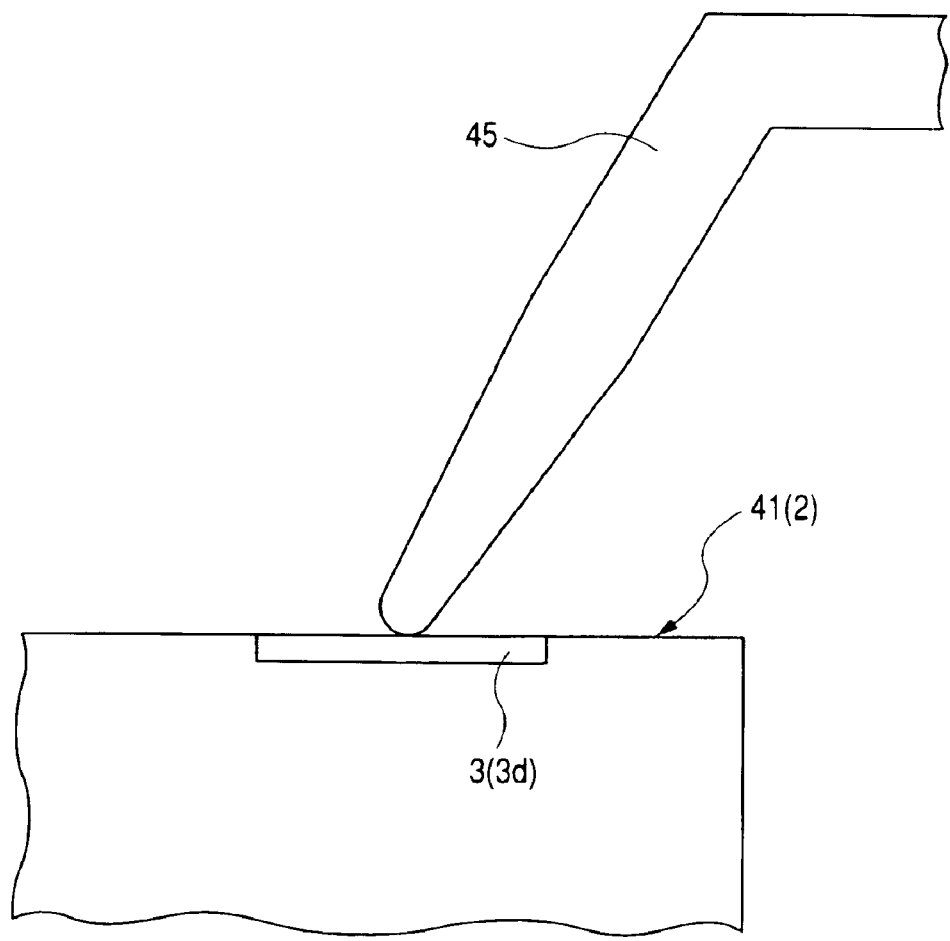
FIG. 31 is a diagram showing a characteristics inspection step in the manufacture of the semiconductor device in the embodiment 7.

A test for electrically testing the functions of the circuit block 12 of the semiconductor chip 2 is performed when the semiconductor chip 2 is in the semiconductor wafer state 40. As shown in FIG. 31, the test is performed in such a manner that a probe needle 45 of a probe card which is electrically connected with a testing device is brought into contact with the testing pad 3d. The testing circuit 12a shown in FIG. 29 is used in an inspection step which is conducted before dividing the semiconductor wafer 40 into individual parts and is not used after assembling the semiconductor chip 2 into the semiconductor device specifically. That is, the testing circuit 12a is operated when the semiconductor chip 2 is in the semiconductor wafer state 40 and is inoperable when the semiconductor chip 2 is in the semiconductor chip state 2.

In an actual operation after assembling the semiconductor chip 2 into the semiconductor device, the testing circuit 12a is inoperable. However, when the testing circuit 12a assumes a floating state in terms of potential, this may become a cause of a drawback in that the internal circuit may perform an erroneous operation. Accordingly, the potential of the testing circuit 12a is usually fixed.

The plurality of bonding pads 3 which include the testing bonding pad 3d are electrically connected with the power source leads 5b2 to which the operational potential Vss (for example, 0V) is supplied by using a wire connection that is substantially similar to the wire connection used in the previously-mentioned embodiment 2. Accordingly, even when the power source lead 5b which is provided for the testing bonding pad conventionally is omitted, the potential of the testing circuit can be fixed in actual use, and, hence, even when the semiconductor device is miniaturized by reducing the number of power source leads 5b, it is possible to provide a highly reliable semiconductor device which exhibits a stable operation.

Embodiment 8

Figure 32:
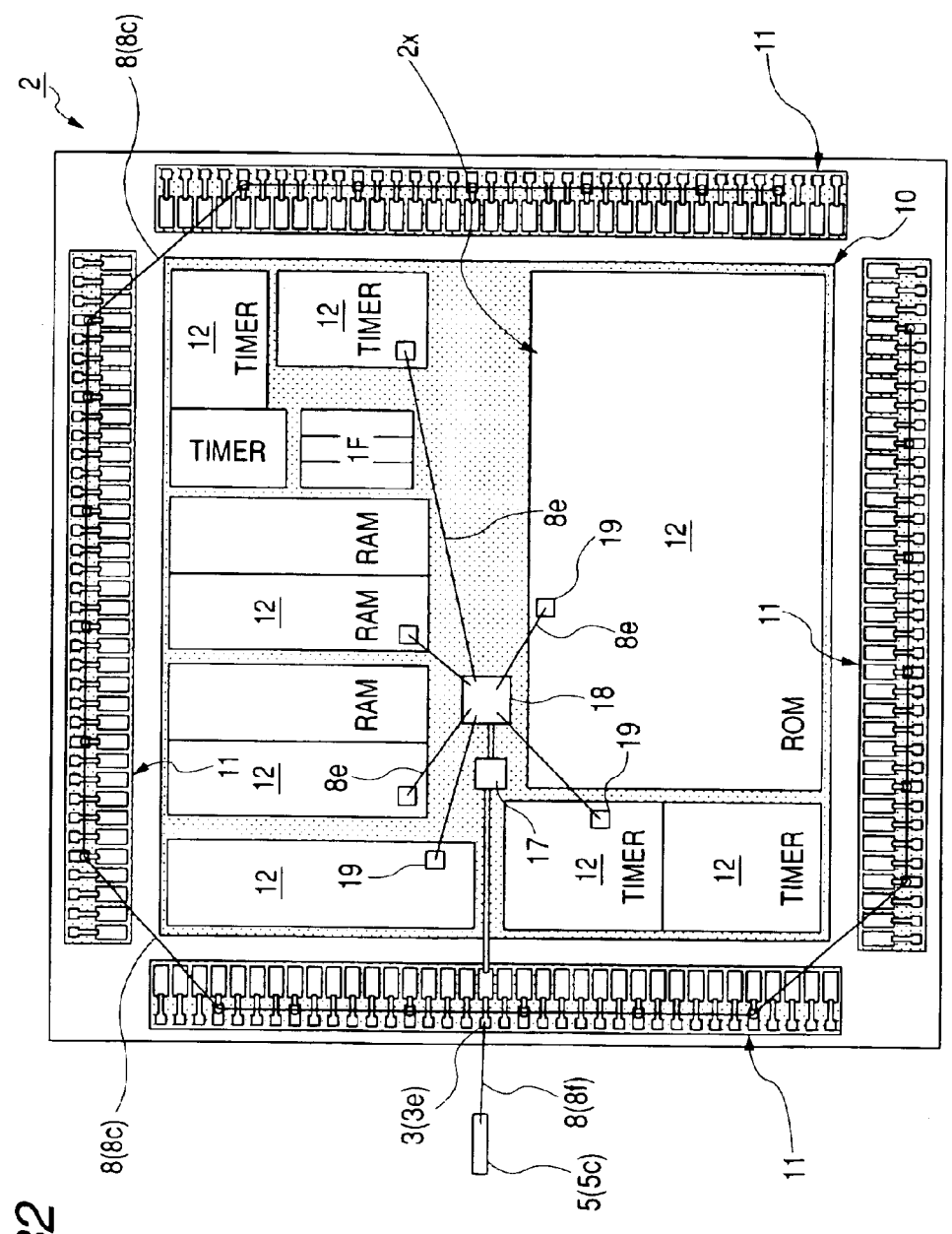
FIG. 32 is a plan view showing the inner structure of the semiconductor device according to an embodiment 8 of the present invention.

FIG. 32 is a plan view showing the inner structure of a semiconductor device according to an embodiment 8 of the present invention.

As shown in FIG. 32, an internal circuit of the semiconductor chip 2 includes a clock circuit 17. Further, a plurality of bonding pads formed on the semiconductor chip 2 include a clock signal pad (clock signal bonding pad) 3e which is electrically connected with an input terminal of the clock circuit 17 via inner wiring of the semiconductor chip 2. Further, a bonding pad 18 which constitutes an output terminal of the clock circuit 17 is arranged on a main surface of the semiconductor chip 2.

The clock signal pad 3e is electrically connected with the signal lead 5c to which a reference signal is supplied from the outside via a bonding wire 8f. Respective blocks 12 are provided with clock input terminals 19 and these clock input terminals 19 are electrically connected with the bonding pad 18 (output terminal of clock circuit 17) via the bonding wire 8e. That is, the reference clock signal supplied from the outside is inputted to the input terminal of the clock circuit 17 via the signal lead 5c, the bonding wire 8f and the clock signal pad 3e, while a clock signal outputted from an output terminal of the clock circuit 17 is inputted to the plurality of respective circuit blocks 12 via the bonding wires 18e.

In this manner, by respectively connecting the bonding pad 18 which constitutes the output terminal of the clock circuit 17 with the clock input terminals 19 of the plurality of circuit blocks using the plurality of bonding wires 8e, compared to a case in which a supply path of a clock signal is formed by wiring on a thin film chip formed by a wafer process, the connection resistance can be lowered, and, hence, the margin for design the of timing can be increased. Further, the freedom of layout design can be enhanced with respect to the supply path of the clock signal, and, hence, a chip area can be reduced.

Embodiment 9

Figure 42:
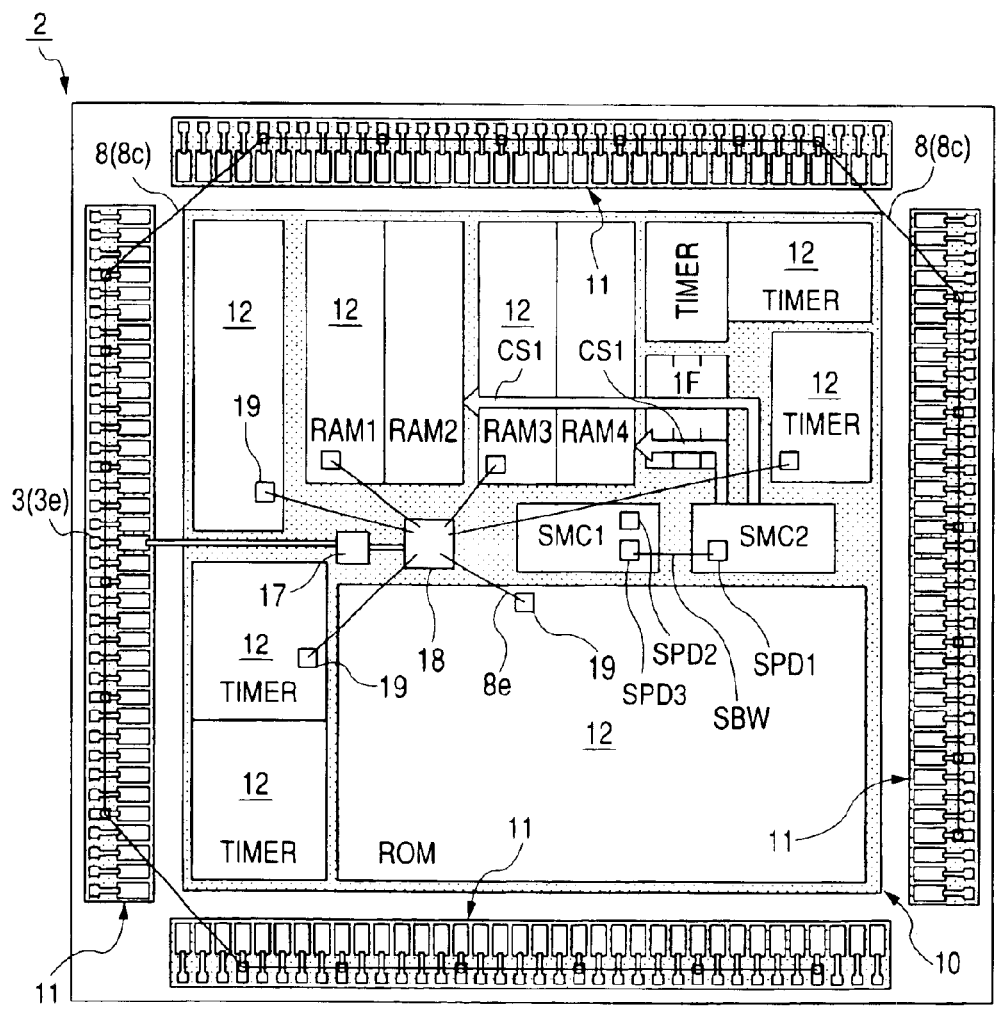
FIG. 42 is a schematic plan view showing the inner structure of the semiconductor device according to the embodiment 9 of the present invention.

FIG. 42 is a plan view showing the inner structure of a semiconductor device according to an embodiment 9 of the present invention. Although the semiconductor device basically has substantially the same constitution as the constitution of the semiconductor device described in conjunction with FIG. 32, the constitutional feature of this embodiment lies in the fact that switching circuits SMC1, SMC2 which can change the capacitances of RAM1 to RAM4 depending on the specification of customers are mounted on a main surface of the chip. In connection with this embodiment, the explanation is directed to a case in which the capacitances of RAM1 to RAM4 are changed in a stage of the wire bonding.

Figure 43:
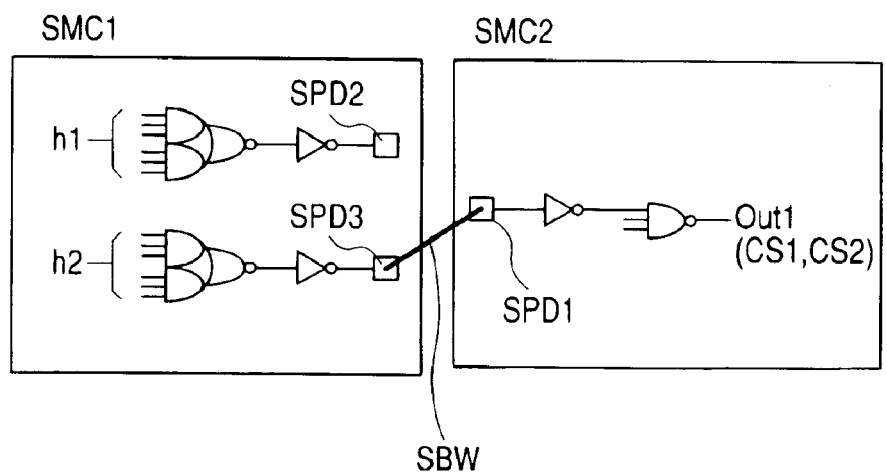
FIG. 43 is a schematic circuit diagram view showing the inner structure of the semiconductor device according to the embodiment 9 of the present invention.

The switching circuits SMC1, SMC2 are circuit blocks which are referred to as soft modules such as system control circuits, bus control circuits and the like. For example, as shown in FIG. 43, the switching circuit SMC1 supplies an output signal to a changeover bonding pad SPD2 in response to an input signal In1, or it supplies an output signal to a changeover bonding pad SPD3 in response to an input signal In2.

On the other hand, in response to inputting of the output signal supplied to one of the changeover bonding pad SPD2 and the changeover bonding pad SPD3 into a changeover bonding pad SPD1 via the bonding wire SWB, the switching circuit SMC2 supplies a given output signal Out1 (CS1, CS2) to the RAM1 to RAM4.

This example shows a case in which by connecting the changeover bonding pads SPD3 and SPD1 to each other using a bonding wire SWB, the circuit blocks 12 of all of RAM1 to RAM4 are selected in response to the abovementioned output signal Out1 (CS1, CS2) and, capacitances of 4K bites, for example, can be obtained. Further, when the changeover bonding pads SPD3 and SPD1 are connected to each other using a bonding wire SWB, only the RAM1 and the RAM2 are selected, and, hence, capacitances of 2K bites, for example, can be obtained.

Figure 22:
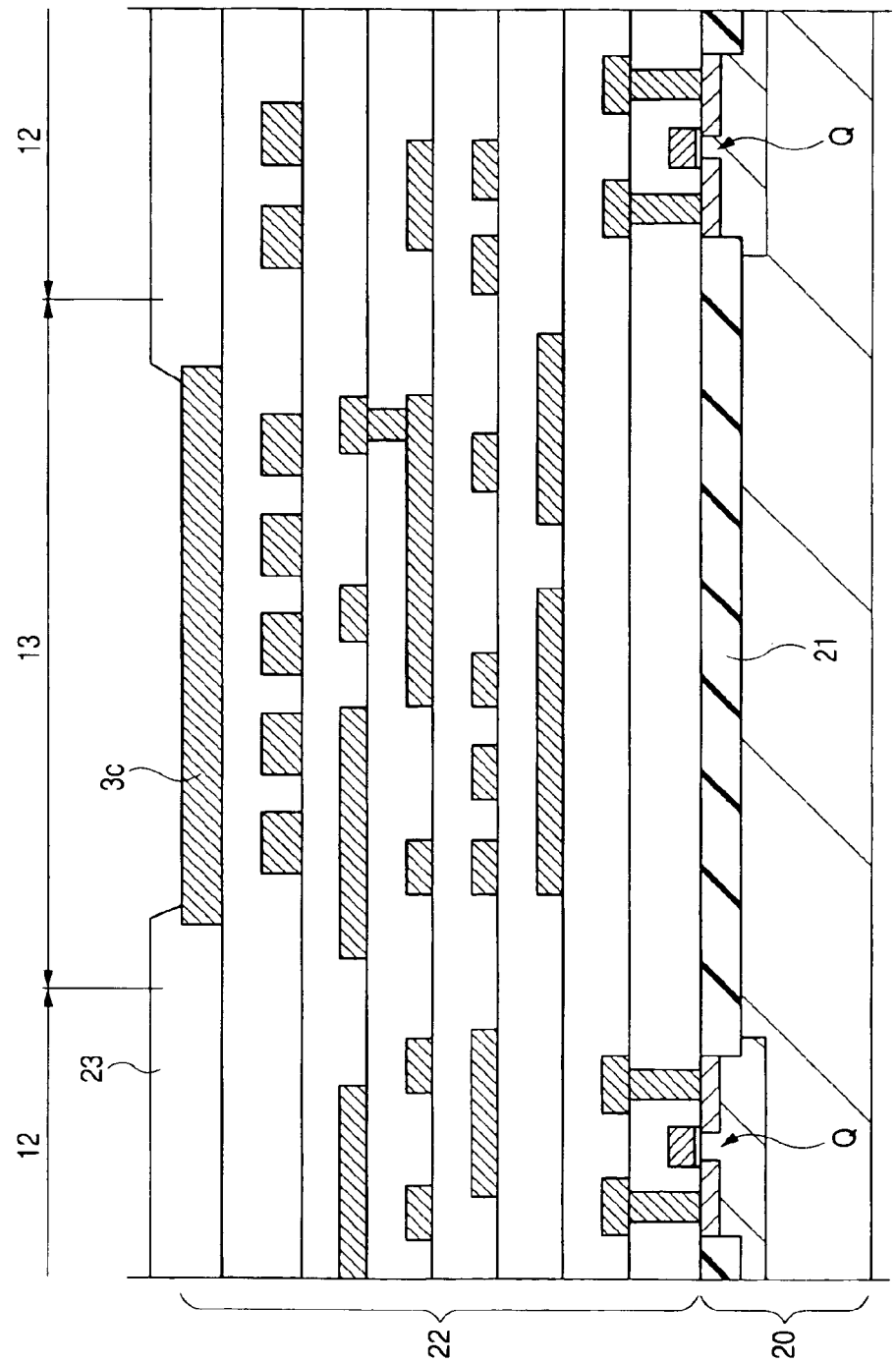

As the abovementioned bonding wire SWB, the bonding wire 8 described in conjunction with the abovementioned embodiments 1 to 7 is applicable. Further, the changeover bonding pads SPD1 to SPD3 can be formed by steps substantially equal to the steps of forming the bonding pads 3c explained in conjunction with FIG. 22. In this manner, the specification of the clients can be changed over at the wire bonding stage, and, hence, for example, compared to a technique which determines the specification of clients in a step of forming multi-layered wiring of an IC chip (for example, a master slicing step of aluminum wiring), it is possible to enhance the TAT (Turn Around Time) of the product development and, at the same time, no particular steps are required for this embodiment.

Further, although the explanation is directed only to the changeover of the RAM capacitances in this embodiment, this embodiment is applicable to the changeover of other chip functions (for example, ROM capacitances, presence or non-presence of ROMs, gain of I/O buffer).

Although the present invention has been specifically explained in conjunction with the abovementioned embodiments, it is needless to say that the present invention is not limited to the abovementioned embodiments and various modifications can be made without departing from the gist of the present invention.

For example, although the supply of power to the internal circuit 12 is performed by the power source line 15 in FIG. 14, portions of the power source line 15 may be replaced with the bonding wires 8e and the operational potential may be supplied to the respective internal circuits (modules) via the bonding wires. In this case, power source inputting terminals dedicated to respective internal circuits may be formed using a structure substantially equal to the structure of the pads 3c shown in FIG. 22, and the ends on one side of the replacing bonding wire 8e may be connected to the dedicated power source inputting terminals. Due to such a constitution, the portions of the power source line 15 which are formed inside the semiconductor chip become unnecessary, thus contributing to shrinking of the semiconductor chip. Further, the wiring resistance is lowered, and, hence, the potential can be supplied in a stable manner.

Figure 39A:
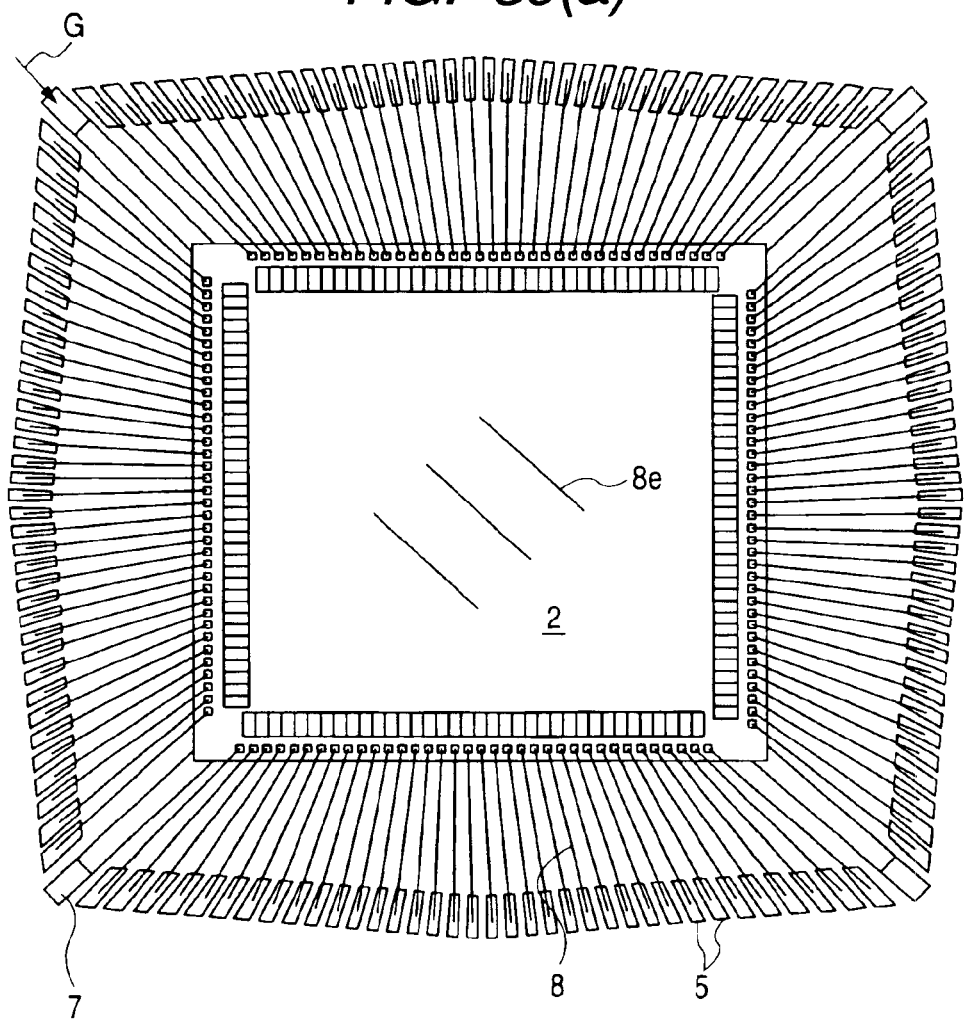
Figure 39B:
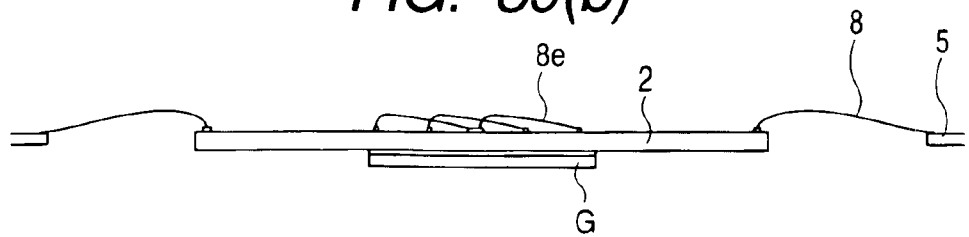

Further, when the abovementioned dedicated power source inputting terminals and the like are formed on the semiconductor chip, and they are connected to each other by the bonding wires 8e, as shown in FIG. 39(a) and FIG. 39(b), by arranging the abovementioned dedicated power source inputting terminals in the inflow direction of the resin injected from a resin injection gate G at the time of forming the sealing body 9, the flowing-away of the bonding wires 8e which connect these terminals to each other can be made difficult. Accordingly, the connection between the wires and the disconnection of the wires can be prevented, whereby it is possible to provide an electrically highly reliable package.

Figure 40A:
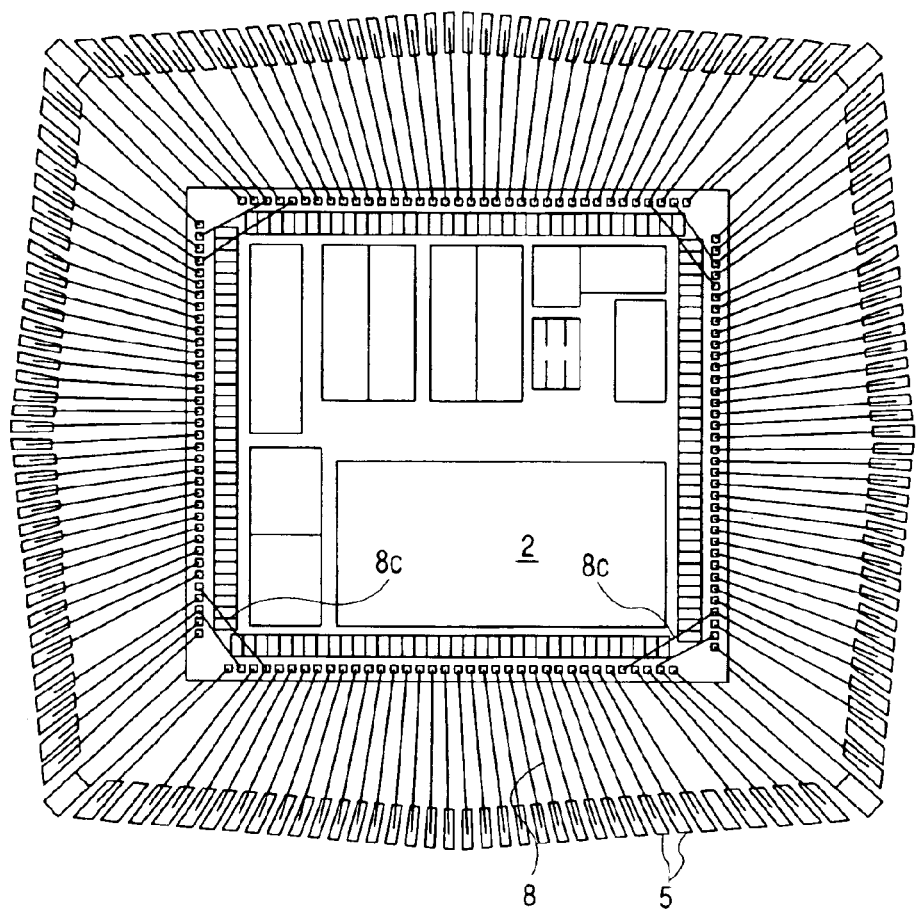
Figure 40B:
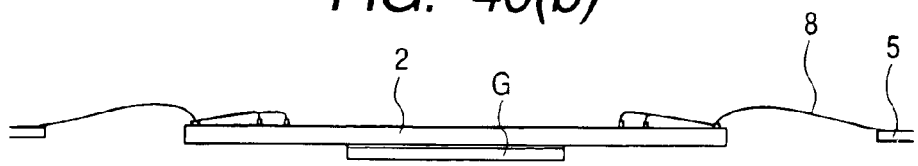

Further, as shown in FIG. 40(a) and FIG. 40(b), the bonding wires 8c which connect between the power source bonding pads may be partially applied in plural numbers at four corners of the semiconductor chip.

Figure 41A:
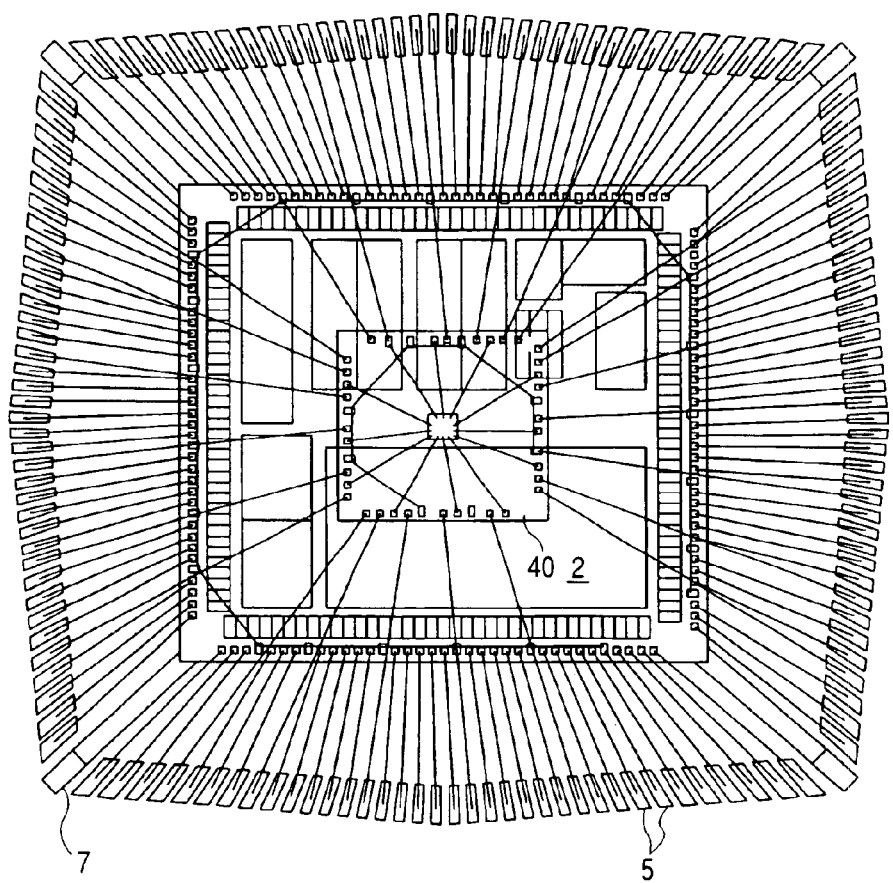
Figure 41B:
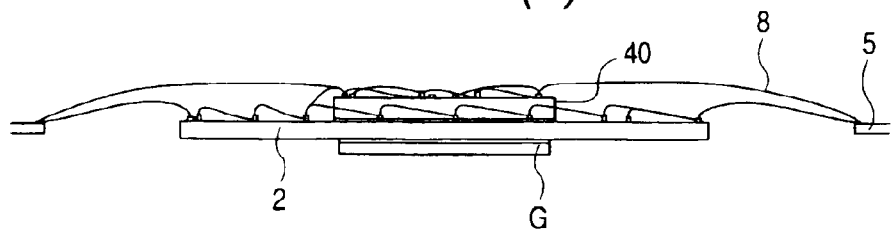

Further, as shown in FIG. 41(a) and FIG. 41(b), a second semiconductor chip 40 may be further stacked on a main surface of the semiconductor chip 2, and the constitution of each embodiment may be applied to the stacked second semiconductor chip 40.

In this case, although not shown in the drawing, signal pads formed on the second semiconductor chip 40 are connected to the signal pads 3a formed on the first semiconductor chip 2 disposed below the second semiconductor chip 40 by way of bonding wires, or they are directly connected to the signal leads 5a using bonding wires.

Further, although not shown in the drawing, the present invention may be applicable to a MCP (Multi Chip Package) in which a plurality of semiconductor chips are mounted on a printed wiring circuit board in plane and the semiconductor chips are housed in one package.

To briefly recapitulate the advantageous effects obtained by representative features of the present invention disclosed in this specification, the following features is indicated.

According to the present invention, it is possible to miniaturize the semiconductor device.

What is claimed is:

1. A semiconductor device comprising:
a semiconductor chip having a main surface;
an internal circuit which is formed on the main surface of the semiconductor chip;
an interface circuit which is formed on the main surface of the semiconductor chip and includes a plurality of I/O cells which are arranged to surround the internal circuit in plane;
a plurality of bonding pads which are formed on the main surface of the semiconductor chip, are arranged between the interface circuit and sides of the semiconductor chip and include first power source bonding pads, second power source bonding pads and a plurality of signal bonding pads;
power source wiring which is formed on the main surface of the semiconductor chip, is connected to the first and second power source bonding pads in common, and supplies an operational potential to the plurality of I/O cells;
a plurality of leads which are arranged around the semiconductor chip and include first power source leads and a plurality of signal leads;
a plurality of bonding wires which include first bonding wires for connecting the first power source bonding pads with the first power source leads, second bonding wires for connecting the first power source bonding pads with second power source bonding pads and a plurality of third bonding wires for connecting a plurality of signal bonding pads with the plurality of signal leads; and
a sealing body which seats the semiconductor chip, the plurality of bonding wires and some of the plurality of leads.

2. The semiconductor device according to claim 1, wherein respective electric resistances of the plurality of bonding wires are lower than an electric resistance of the power source wiring.

3. The semiconductor device according to claim 1, wherein the power source wiring extends along a direction of an arrangement of the plurality of I/O cells.

4. The semiconductor device according to claim 1, wherein the first and second power source bonding pads are arranged to sandwich the plurality of signal bonding pads in plane.

5. The semiconductor device according to claim 1,
wherein the interface circuit further includes a plurality of power source cells, and
wherein the first and second power source bonding pads are connected to selected power source cells among the plurality of power source cells.

6. The semiconductor device according to claim 1, wherein the second power source bonding pads are not connected to the plurality of leads.

7. The semiconductor device according to claim 1, wherein the plurality of leads extend toward the outside and the inside of the sealing body and project from a side surface of the sealing body.

8. The semiconductor device according to claim 1,
wherein the sealing body includes a main surface which is positioned at a side at which the main surface of the semiconductor chip is positioned and a back surface which is positioned at a side opposite to the main surface, and
wherein the plurality of leads are exposed from a back surface of the sealing body.

9. A semiconductor device comprising:
a semiconductor chip;
a plurality of I/O cells which are formed along sides of the semiconductor chip;
a plurality of bonding pads which are formed between the plurality of I/O cells and sides of the semiconductor chip;
a plurality of leads which are arranged around the semiconductor chip;
first bonding wires which electrically connect the plurality of leads with the plurality of bonding pads; and
second bonding wires which electrically connect arbitrary bonding pads to each other among the plurality of bonding pads.

10. A semiconductor device comprising:
a semiconductor chip having a main surface;
an internal circuit which is formed on the main surface of the semiconductor chip;
an interface circuit which is formed on the main surface of the semiconductor chip and includes a plurality of I/O cells which are arranged to surround the internal circuit in plane;
a plurality of bonding pads which are formed on the main surface of the semiconductor chip, are arranged between the interface circuit and sides of the semiconductor chip and include first power source bonding pads, second power source bonding pads and a plurality of signal bonding pads;

power source wiring which is formed on the main surface of the semiconductor chip, is connected to the first and second power source bonding pads in common, and supplies an operational potential to the plurality of I/O cells;

a printed wiring circuit board which mounts the semiconductor chip on a first surface thereof, and has a plurality of connecting portions including first power source connecting portions which are arranged around the mounted semiconductor chip and a plurality of signal connecting portions;

a plurality of bonding wires which include first bonding wires for connecting the first power source bonding pads with the first power source connecting portions, second bonding wires for connecting the first power source bonding pads with second power source bonding pads and third bonding wires for connecting the plurality of signal bonding pads with the plurality of signal leads;

a plurality of projection-like electrodes which are arranged on a second surface of the printed wiring circuit board which faces the first surface of the printed wiring circuit board in an opposed manner and are electrically connected with the plurality of connecting portions of the printed wiring circuit board, and a sealing body which seals the semiconductor chip, the plurality of bonding wires and the first surface of the printed wiring circuit board.

11. The semiconductor device according to claim 10, wherein respective electric resistances of the plurality of bonding wires are lower than an electric resistance of the power source wiring.

* * * * *